US012701920B2

(12) United States Patent
Correll et al.

(10) Patent No.: US 12,701,920 B2
(45) Date of Patent: Aug. 4, 2026

(54) CAPACITIVE SELF-SENSING FOR ELECTROSTATIC TRANSDUCERS WITH HIGH VOLTAGE ISOLATION

(71) Applicant: The Regents of the University of Colorado, a body corporate, Denver, CO (US)

(72) Inventors: Nikolaus Correll, Boulder, CO (US); Khoi D. Ly, Boulder, CO (US); Nicholas Alexander Kellaris, Boulder, CO (US); Christoph Matthias Keplinger, Gerlingen (DE)

(73) Assignee: The Regents of the University of Colorado, a body corporate, Denver, CO (US)

( * ) Notice: Subject to any disclaimer, the term of this patent is extended or adjusted under 35 U.S.C. 154(b) by 718 days.

(21) Appl. No.: 17/928,453

(22) PCT Filed: May 29, 2021

(86) PCT No.: PCT/US2021/035041
§ 371 (c)(1),
(2) Date: Nov. 29, 2022

(87) PCT Pub. No.: WO2022/050997
PCT Pub. Date: Mar. 10, 2022

(65) Prior Publication Data
US 2023/0200250 A1 Jun. 22, 2023

Related U.S. Application Data

(60) Provisional application No. 63/032,209, filed on May 29, 2020.

(51) Int. Cl.
H10N 30/00 (2023.01)
G01D 5/24 (2006.01)
(Continued)

(52) U.S. Cl.
CPC ............ H10N 30/802 (2023.02); G01D 5/24 (2013.01); G01L 1/144 (2013.01); H10N 30/101 (2024.05); H10N 30/20 (2023.02)

(58) Field of Classification Search
CPC .... H10N 30/802; H10N 30/101; H10N 30/20; G01D 5/24; G01L 1/144; G01L 1/14
See application file for complete search history.

(56) References Cited

U.S. PATENT DOCUMENTS 3,770,102 A    11/1973   De
4,273,239 A    6/1981   Thwaites et al.
(Continued)

FOREIGN PATENT DOCUMENTS

EP    2993480 A1 *   3/2016   ............. G01R 15/06
EP    3988450 A1    4/2022
(Continued)

OTHER PUBLICATIONS

International Search Report and Written Opinion, PCT/US21/35041, mailed Mar. 1, 2022.
(Continued)

*Primary Examiner* — Julio C. Gonzalez
(74) *Attorney, Agent, or Firm* — Kilpatrick Townsend & Stockton LLP

(57) ABSTRACT

Transducer systems disclosed herein include self-sensing capabilities. In particular, electrostatic transducers include a low voltage electrode and a high voltage electrode. A low voltage sensing unit is coupled with the low voltage electrode of the electrostatic transducer. The low voltage sensing unit is configured to measure a capacitance of the electrostatic transducer, from which displacement of the electrostatic transducer may be calculated. High voltage drive signals received by the high voltage electrode during actuation may be isolated from the low voltage sensing unit. The
(Continued)

isolation may be provided by dielectric material of the electrostatic transducer, a voltage suppression component, and/or a voltage suppression module comprising a low impedance ground path. In the event of an electrical failure of the transducer, the low voltage sensing unit may be isolated from high voltages.

13 Claims, 17 Drawing Sheets

(51) Int. Cl.
*G01L 1/14*          (2006.01)
*H10N 30/20*      (2023.01)
*H10N 30/80*      (2023.01)

(56) References Cited

U.S. PATENT DOCUMENTS

| 4,502,593 | A | 3/1985 | Goor |
| 6,223,888 | B1 | 5/2001 | Jahns |
| 6,626,416 | B2 | 9/2003 | Sharma et al. |
| 7,046,497 | B1 * | 5/2006 | Bonin ...................... H01G 5/14 |
| | | | 361/290 |
| 7,667,946 | B2 | 2/2010 | Choi et al. |
| 7,841,461 | B2 | 11/2010 | Nguyen et al. |
| 8,408,384 | B2 | 4/2013 | Rogers |
| 10,302,586 | B2 | 5/2019 | Sun et al. |
| 10,631,083 | B1 | 4/2020 | Gandhi et al. |
| 10,640,033 | B1 | 5/2020 | Gandhi et al. |
| 10,859,101 | B2 | 12/2020 | Rowe |
| 10,995,779 | B2 | 5/2021 | Keplinger et al. |
| 11,408,452 | B2 | 8/2022 | Keplinger et al. |
| 2007/0170431 | A1 | 7/2007 | Choi et al. |
| 2009/0115285 | A1 | 5/2009 | Najafi et al. |
| 2010/0033196 | A1 * | 2/2010 | Hayakawa .............. G01L 1/142 |
| | | | 324/686 |
| 2020/0079245 | A1 | 3/2020 | Rowe et al. |
| 2020/0130202 | A1 | 4/2020 | Gandhi et al. |
| 2020/0132223 | A1 | 4/2020 | Prokhorov et al. |
| 2020/0136525 | A1 | 4/2020 | Gandhi et al. |
| 2020/0136526 | A1 | 4/2020 | Gandhi et al. |
| 2020/0256357 | A1 | 8/2020 | Rowe et al. |

FOREIGN PATENT DOCUMENTS

| WO | 2022050997 | A3 | 3/2022 |
| WO | 2022050997 | A9 | 3/2022 |

OTHER PUBLICATIONS

Lazo, Thomas E., "Notice of Allowance for U.S. Appl. No. 17/883,284," Mailing Date Jun. 13, 2023, 5 Pages.

* cited by examiner

CAPACITIVE SELF-SENSING FOR ELECTROSTATIC TRANSDUCERS WITH HIGH VOLTAGE ISOLATION

CROSS-REFERENCE TO RELATED APPLICATIONS

The present application claims priority to U.S. Provisional Patent Application No. 63/032,209 filed 29 May 2020 entitled "CAPACITIVE SELF-SENSING FOR ELECTRO-STATIC TRANSDUCERS WITH HIGH VOLTAGE ISO-LATION," and PCT International Patent Application No. PCT/US21/35041 filed 29 May 2021 entitled "CAPACI-TIVE SELF-SENSING FOR ELEXTROSTATIC TRANS-DUCERS WITH HIGH VOLTAGE ISOLATION."

The present application is also related to U.S. patent application Ser. No. 16/496,234 filed 20 Sep. 2019 entitled "HYDRAULICALLY AMPLIFIED SELF-HEALING ELECTROSTATIC ACTUATORS," PCT Application No. PCT/US2019/020568 filed 4 Mar. 2019 entitled "HYDRAULICALLY AMPLIFIED SELF-HEALING ELECTROSTATIC TRANSDUCERS HARNESSING ZIP-PING MECHANISM," PCT Application No. PCT/US2020/020978 filed 4 Mar. 2020 entitled "COMPOSITE LAYER-ING OF HYDRAULICALLY AMPLIFIED SELF-HEALING ELECTROSTATIC TRANSDUCERS," PCT Application No. PCT/US2020/020986 filed 4 Mar. 2020 entitled "FOLDABLE HYDRAULICALLY AMPLIFIED SELF-HEALING ELECTROSTATIC (HASEL) TRANS-DUCERS," U.S. Provisional Patent App. No. 62/886,820 filed 14 Aug. 2019 entitled "HYDRAULICALLY AMPLI-FIED SELF-HEALING ELECTROSTATIC PUMPS," and U.S. Provisional Pat. No. 62/946,317 filed 10 Dec. 2019 entitled "HIGH STRAIN PEANO HYDRAULICALLY AMPLIFIED SELF-HEALING ELECTROSTATIC (HA-SEL) TRANSDUCERS." All referenced applications above are incorporated herein by reference in their entirety.

STATEMENT REGARDING FEDERALLY SPONSORED RESEARCH OR DEVELOPMENT

This invention was made with government support under grant number 1739452 awarded by the National Science Foundation and grant number FA9550-15-1-0238 awarded by the U.S. Air Force. The government has certain rights in the invention.

BACKGROUND

Soft robotics is a field of robotic system design charac-terized by materials and structures that exhibit large-scale deformation, high compliance, and rich multifunctionality. The incorporation of soft and deformable structures endows soft robotic systems with compliance and resiliency that makes them well-adapted for unstructured and dynamic environments.

While actuation mechanisms for soft robots vary widely, soft electrostatic transducers such as dielectric elastomer actuators (DEAs) and hydraulically amplified self-healing electrostatic (HASEL) actuators have demonstrated promise due to their muscle-like performance and self-sensing capa-bilities. Self-sensing capabilities (e.g., capacitive self-sens-ing) provide feedback for control of the electrostatic actua-tors. As such, capacitive self-sensing may be used to characterize (e.g., quantify) actuator displacement either in response to a drive signal that actuates the electrostatic actuator or in response to an external force acting to move the electrostatic actuator.

SUMMARY

Despite previous efforts to implement self-sensing in electrostatic transducers, it has been challenging to design compact circuitry that can work alongside high-voltage components—which is beneficial for enabling untethered soft robots of the future or other applications in which component cost, size, and weight may be a concern. Because actuation of electrostatic transducers may include applica-tion of a high voltage drive signal to the actuator to provide actuation of the transducer, self-sensing circuitry has tradi-tionally been incorporated for sensing characteristics of the electrostatic transducer by coupling the self-sensing cir-cuitry to the high voltage drive signal supply, which requires robust sensing circuitry to withstand the high voltages present in such systems.

This disclosure provides a method for capacitive self-sensing that includes a low voltage sensing unit electrically coupled with the electrostatic transducer. The self-sensing systems described herein facilitate isolation of the low voltage sensing unit from any high voltage in the system, which allows for more advantageous circuitry to be used for the sensing unit such as compact, low-cost components. The sensing unit may superimpose a low voltage sensing signal on the low-voltage side of electrostatic transducers (e.g., to the low voltage electrode(s) of the electrostatic transducer). The low voltage sensing signal may be a transient and/or periodic signal, which is generally referred to herein as an alternating current (AC) signal. It may be appreciated that an AC signal may include signals, whether periodic or non-periodic, in any waveform shape including sine, square, triangle, and any other waveform shape. The self-sensing systems described herein may facilitate isolation of the low voltage sensing unit from both direct current (DC) and transient or AC signals including steady-state and transient voltages.

The approach described herein allows the transducer to provide high-voltage isolation between the high voltage drive signal and the sensing unit, which may reduce or eliminate the need for any high-voltage sensing components, thereby facilitating the design of a simple, low-cost circuit using off-the-shelf components. The systems may include a high voltage suppression module. In some examples, the electrostatic transducer itself may comprise the high voltage suppression module to provide high voltage isolation at least in part based on the dielectric of the transducer. In other examples, the high voltage isolation of the electrostatic transducer may be coupled with a separate high voltage suppression module which may be used to further isolate the low voltage sensing unit from the potential exposure to high voltage (e.g., in the event of an electrical failure of the electrostatic transducer which may experience dielectric breakdown).

Further still, the low voltage sensing unit may be used to measure a capacitance of an electrostatic transducer whether powered or not. That is, electrostatic transducers may undergo a change in capacitance upon physical interaction with the transducer (e.g., by application of an external force on the transducer). The low voltage sensing unit may be operative to measure a physical condition (e.g., displace-ment) of the electrostatic transducer in the absence of a drive signal (e.g., upon application of an external force to the transducer resulting in displacement of the transducer).

Thus, the low voltage sensing unit may measure the capacitance of the transducer in response to a drive signal applied and/or in response to an external force acting to the transducer.

Using the example sensing unit configurations described herein, simultaneous sensing and actuation for a number of types of electrostatic transducers may be facilitated. For example, the electrostatic transducer may comprise a dielectric elastomer actuator (DEA) or a hydraulically amplified self-healing electrostatic (HASEL). In specific examples, circular DEAs and HASEL actuators demonstrate accurate estimated displacements with errors under 4%. The resulting self-sensing unit may be provided as a circuit that is provided in a compact and portable system that couples high voltage actuation, sensing, and actuator state computation (e.g., displacement values). In turn, the sensing unit and/or other control circuitry provided herein may facilitate untethered, multifunctional soft robotic systems. In addition, the capability of the self-sensing transducers described herein are used to demonstrate the capabilities of the system with feedback-control of a robotic arm powered by Peano-HASEL actuators.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTION

Figure 1:
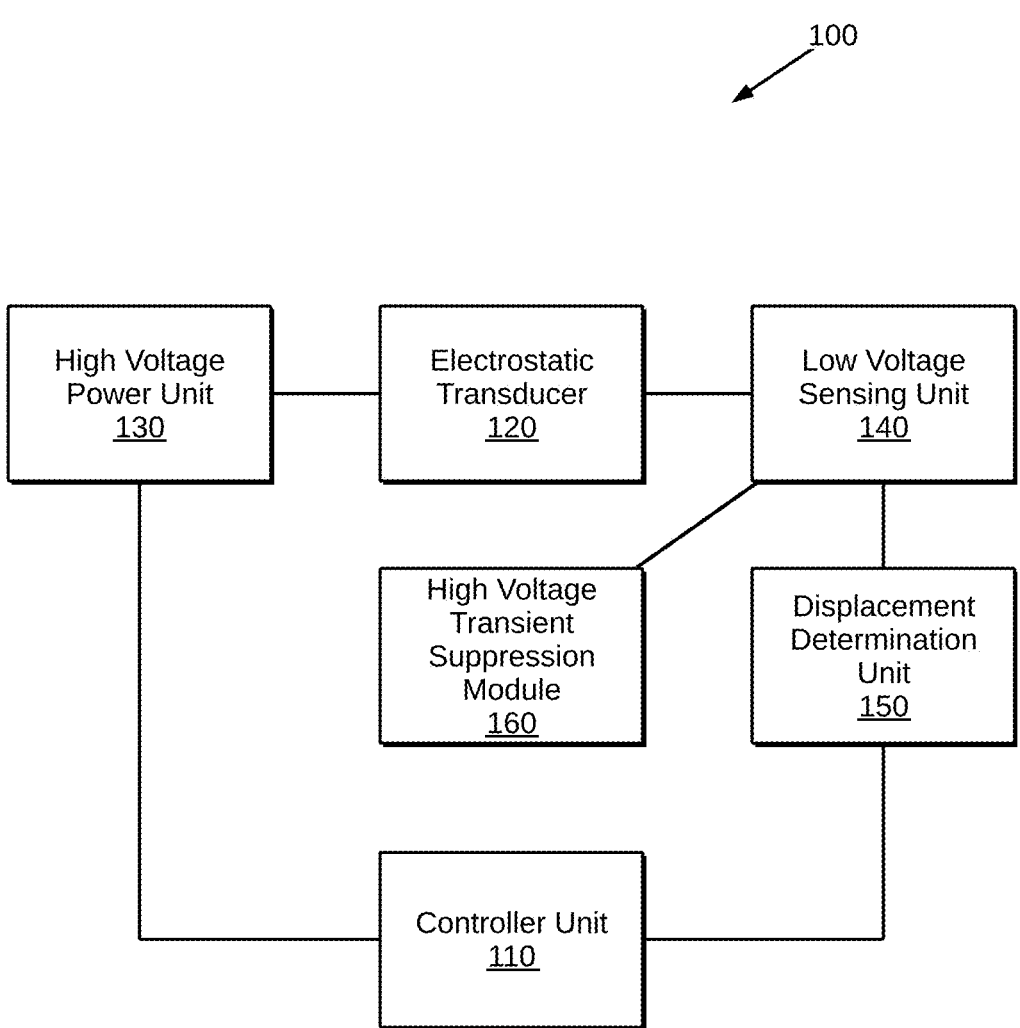
FIG. 1 depicts a schematic view of a system using a low voltage sensing unit for self-sensing of an electrostatic transducer, in accordance with aspects of this disclosure.

Traditional, rigid-bodied robots have high efficiency and precision in a well-defined environment but have limited capabilities in environments with uncertainty. On the other hand, soft robots exhibit large-scale deformation, high compliance, and the rich multifunctionality of natural organisms. Such soft robotic characteristics represent several advantages, including the ability to mitigate uncertainty with passive compliance, perform highly dexterous tasks, and exhibit resilience toward impacts, wear, and tear. Soft robotics is a growing field of study, with numerous methods of actuation including thermal actuation, pneumatic actuation, hydraulic actuation, cable-driven actuation, and electrostatic actuation. Of these, electrostatic transducers such as DEA and HASEL actuators are particularly attractive due to their high-speed operation, high efficiency, controllability, and the ability to produce muscle-like forces and strains.

In relation to electrostatic transducers, self-sensing provides control advantages as described above because self-sensing may allow the actuator to itself provide feedback to a control system for the actuator. Therefore, an awareness of the displacement of the transducer (e.g., in response to a drive signal or an external force acting on the transducer) may allow for more robust control of the transducer. In this regard, the self-sensing capability described herein may generally be in response to a physical response of the transducer either in response to a drive signal for actuation of the transducer or passively in response to application of an external force to the transducer. Prior proposed approaches for sensing and controlling electrostatic transducers have included periodic high voltage input, transient effects of charging and discharging, and changes in resistance in the transducer electrodes. The first two of these prior sensing methods are unable to sense and drive the transducers independently, while the third method is susceptible to signal creep due to a slow decrease in electrode resistance over time. One of the most common capacitive self-sensing techniques for DEAs is based on the concept of superposition, or coupling, of a sinusoidal low voltage signal for sensing on a high voltage output signal for driving the transducer. However, in these designs, the low voltage signal is coupled to the high voltage drive voltage (e.g., a drive signal) on the high voltage electrode of the electrostatic transducers, therefore the circuit designs require large, specialized, or expensive electronic components for combining the sinusoidal low voltage signals with the high voltage drive signals. In turn, this approach is limited to either using a high voltage power amplifier capable of high frequency signal generation or including an AC-AC transformer with sufficient high voltage isolation to protect the low voltage sensing components. Neither approach provides a favorable solution in soft-robotic applications in which the size, weight, and cost of the control system are all preferably reduced to provide applicability in a variety of potential contexts.

This disclosure introduces a new method for capacitive self-sensing of electrostatic transducers that superimposes a low voltage sensing signal through a low voltage electrode (e.g., ground side) of electrostatic transducers. This implementation allows the transducer to provide high voltage isolation of the low voltage sensing components in the low voltage sensing unit, irrespective of the high voltage amplitude of the drive signal required for a given transducer, thus providing an application-agnostic setup. This disclosure further incorporates an optional voltage suppression module that provides different configuration for suppression of voltages to which the low voltage sensing unit is exposed. The voltage suppression module may provide a low impedance path to ground, which allows for robust operation even in the event of electrical failure (e.g. dielectric breakdown) of the transducer. Therefore, this approach eliminates the need for any high-voltage sensing components, and facilitates the design of a simple, low-cost circuit using off-the-shelf components. Using the approaches described herein, a transducer may be deformed (either through application of a high voltage drive signal, or mechanical manipulation to apply an external force to the transducer, or both simultaneously) such that an estimate of the capacitance (e.g., a sensed capacitance) for a wide range of electrostatic transducers including a circular DEA and HASEL actuators may be provided. In turn, the sensed capacitance may be readily mapped to a corresponding estimated displacement of the transducer. This arrangement may provide robust capabilities of a control circuit. This is demonstrated with an example of a feedback-controlled HASEL-powered arm. As such, a miniature system is described that couples actuation, sensing, and displacement computation for a wide range of electrostatic transducers powered by a variety of high voltage power supply units.

As used herein, high voltage and low voltage may be evaluated in relative relation. That is, a high voltage may generally be larger than a low voltage. In some instances, the high voltage may be significantly greater than the low voltage such as at least two times as great, at least 5 times as great, at least 10 times as great, or even at least 100 times greater. For instance, the low voltage may comprise 24V or less, while the high voltage may be greater than 24V.

FIG. 1 illustrates an example of a self-sensing transducer control system 100 according to the present disclosure. The system 100 includes a controller unit 110 that may comprise a microprocessor controller and memory for control of the system 100. A high voltage power unit 130 is provided that is electrically coupled to an electrostatic transducer 120. The electrostatic transducer 120 may comprise a high voltage electrode, which may also be referred to as a high voltage side of the transducer 120. The high voltage electrode may extend relative to one or more dielectric portions of the transducer 120. In turn, the transducer 120 may also include a low voltage electrode (which may also be referred to interchangeably as a ground electrode, a low voltage side, or a ground side of the transducer 120).

The transducer 120 may be any appropriate type of electrostatic transducer having a general arrangement in which a high voltage electrode is provided on a first side of a dielectric portion and a low voltage electrode provided on a second side of the dielectric portion. Examples of electrostatic transducers may include DEAs or HASEL actuators including any arrangement or configuration thereof described in the applications incorporated by reference above. In this regard, the HASEL actuator may comprise a Peano-HASEL actuator, a high-strain Peano-HASEL actuator, a HASEL zipper actuator, or any other appropriate configuration of electrostatic actuator without limitation.

The system 100 also includes a low voltage sensing unit 140. As briefly described above, the low voltage sensing unit 140 is electrically coupled with the electrostatic transducer 120. In turn, the low voltage sensing unit 140 may apply a low voltage signal (e.g., a transient or alternating current (AC) wave signal) to the low voltage electrode of the transducer 120. In turn, the low voltage sensing unit 140 also includes components capable of sensing a capacitance of the electrostatic transducer 120 including various arrangements described in greater detail below. In any regard, the low voltage sensing unit 140 may be operative to sense a capacitance of the electrostatic transducer 120. In turn, the sensed capacitance may be indicative of a state of displacement of the transducer 120. For instance, upon actuation by a high voltage drive signal imparted by the high voltage power unit 130, the transducer 120 may be actuated such that the capacitance of the transducer changes 120 and is sensed by the low voltage sensing unit 140. Additionally or alternatively, an applied external force (e.g., mechanical manipulation of the transducer 120) may also be sensed in a change in capacitance of the transducer 120. In any regard, the low voltage sensing unit 140 may provide the sensed capacitance of the transducer 120 to a displacement determination unit 150. The displacement determination unit 150 may map the sensed capacitance of the transducer 120 to a corresponding displacement of the transducer 120. In turn, the displacement determination unit 150, upon receipt of the sensed capacitance of the transducer 120 may communicate the corresponding displacement to the controller unit 110 to provide feedback regarding a state (e.g., a displacement) of the transducer 110.

The system 100 may also include a voltage suppression module 160. The voltage suppression module 160 may be in electrical communication with the low voltage sensing unit 140 or other component in the system 100 to act to protect the low voltage sensing unit 140 from any high voltage in the system (e.g., a high voltage drive signal imparted by the high voltage power unit 130 to the high voltage electrode). The voltage suppression module 160 may provide isolation from both direct current (DC) voltages and/or alternating current (AC) voltages in the system 100.

In an example, the electrostatic transducer 120 alone comprises the voltage suppression module 160 in that the dielectric of the electrostatic transducer 120 may isolate the low voltage sensing unit 140 from any high voltage in the system 100. Additionally or alternatively, the voltage suppression module 160 may comprise a separate module (e.g., including a voltage suppression component which may be an analog component). That is, while the dielectric portion of the transducer 120 provides electrical isolation between the high voltage electrode and the low voltage electrode, and in turn, between the high voltage drive signal and the low voltage sensing unit 140, situations may arise in which electrical failure of the transducer 120 (e.g., dielectric breakdown of the dielectric portion) occurs. While selective operation of the transducer 120 may be provided to avoid such circumstances of dielectric breakdown, the suppression module 160 may provide a low impedance ground path such that any voltage spikes at the ground electrode may be mitigated by providing a low impedance path to avoid exposure of the components of the low voltage sensing unit 140 to high voltage, which may cause failure of the low voltage sensing unit 160. A number of arrangements for the suppression module 160 are contemplated as will be described in greater detail below.

Figure 2:
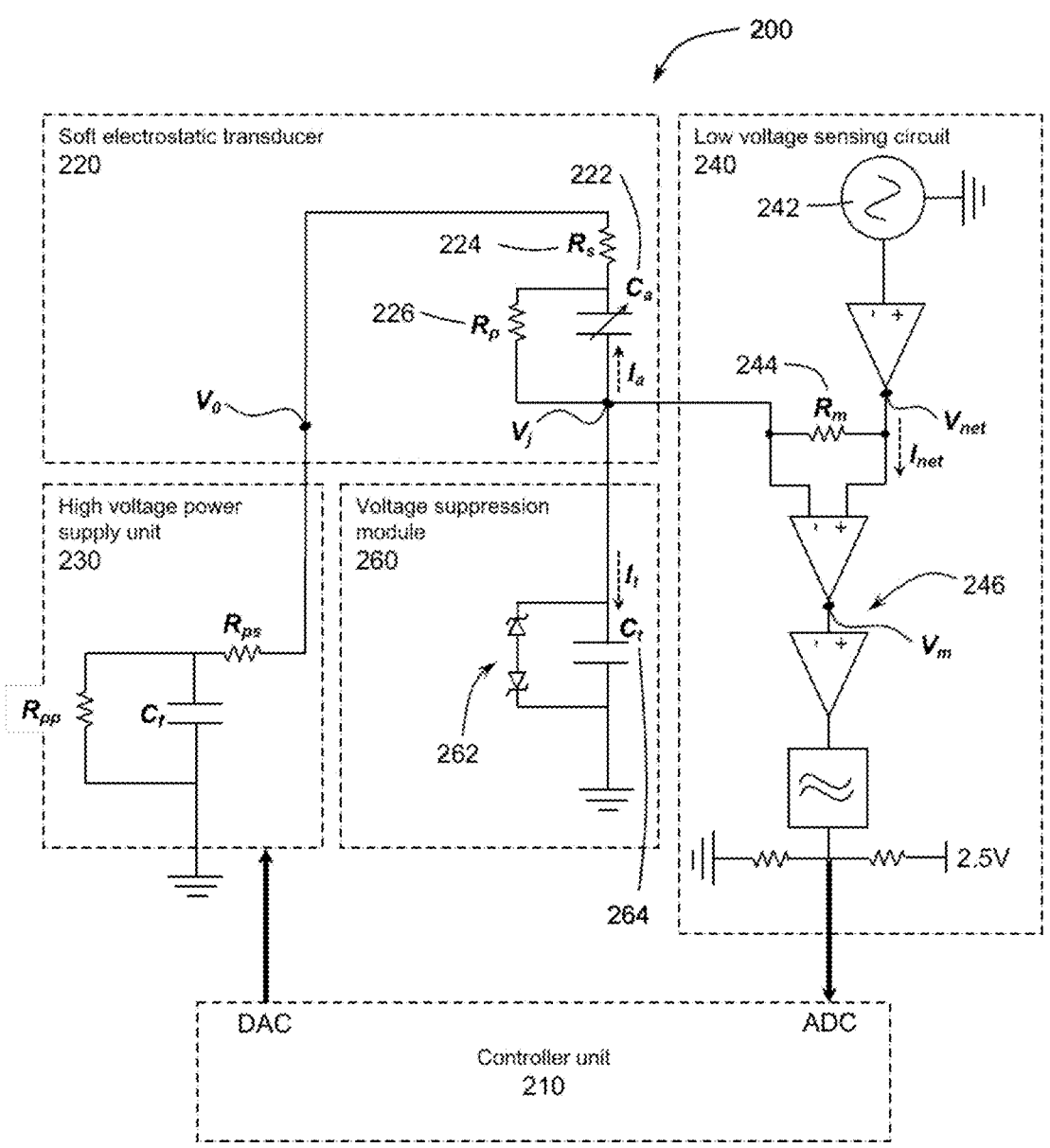
FIG. 2 depicts a detailed schematic view of an example system including a low-voltage self-sensing circuit, in accordance with aspects of this disclosure.

With further reference to FIG. 2, a more detailed schematic view of an example of a self-sensing system 200 is shown. Specifically, the system 200 includes a high voltage power unit 230, an electrostatic transducer 220, a low voltage sensing unit 240, and a controller unit 210 generally as described with respect to FIG. 1. The electrostatic transducer 220 can be electrically modeled as a variable capacitor 222 having capacitance $C_a$ with a series resistance ($R_s$) 224 and a parallel resistance ($R_p$) 226. As the transducer deforms under the influence of electrical or mechanical forces, its capacitance changes. The series resistance 224 represents the resistance of the high voltage electrode and the low voltage electrode, which can be variable or fixed depending on the electrode design. In particular, stretchable electrodes used in DEAs often exhibit resistances that are strongly dependent on deformation of the conductive percolating networks that occurs during actuation, or degradation of the conductive networks with repeated cycling. The variable parallel resistance 226 represents the resistance of the dielectric portion, which changes as the transducer 220 deforms.

The self-sensing arrangement presented herein measures the capacitance of an electrostatic transducer 220 during deformation using a low voltage AC signal coupled through the low voltage electrode of an electrostatic transducer 220. This allows the transducer 220 to serve as a high voltage isolator for the sensing components of the low voltage sensing unit 240, irrespective of the high voltage amplitude provided by the high voltage power unit 230 for actuation of a given transducer 220. FIG. 2 shows a schematic of the self-sensing system 200, transducer model 220, and a generalized high voltage power supply unit 230. The capacitive self-sensing is based on measuring a voltage drop across a measurement resistor ($R_m$) 244 and measuring a phase difference compared to the net AC sensing voltage signal ($V_{net}$) which is generated by an AC wave generator 242. In this regard, the high voltage drive signal ($V_o$) is applied to the high voltage electrode and the high-frequency AC sensing voltage signal ($V_{net}$) is applied to the low voltage electrode of the transducer 120. The sensing low voltage signal ($V_{net}$) is therefore coupled to the high voltage driving signal ($V_o$) via the low voltage side of the electrostatic transducer 120. The AC low voltage signal may benefit from the internal path to ground through the high voltage power supply unit 230 via its high voltage ripple filtering capacitor ($C_f$) and its parallel resistor ($R_{pp}$). Since many types of power supplies have a high voltage ripple filtering capacitor ($C_f$), this variation to the system 200 can be applied to a wide range of types of high voltage power supply units. Referring back to system 200 in FIG. 2, the transducer ($C_a$) and the high voltage ripple filtering ($C_f$) capacitors are connected in series and the combined component is placed in parallel with a voltage suppression capacitor ($C_t$) of a voltage suppression module 260. Even in the absence of a filtering capacitor, a separate path to ground can be added, such as a resistor or a capacitor external to the power supply as will be described in further detail below with respect to FIG. 16. One specific example of a voltage suppression module 260 is shown in FIG. 2. In the event of electrical failure of the transducer 220, the voltage suppression capacitor ($C_t$) 264, together with a pair of Zener diodes 262, helps suppress change in the junction voltage ($V_j$) with high voltage AC or DC signals and filters the high voltage ripple from the high voltage supply. Thus, the voltage suppression module 260 may protect the sensing circuit 240 and provide a reliable way to measure voltage across the measurement resistor ($R_m$). However, too large of a transient suppression capacitor ($C_t$) decreases the self-sensing sensitivity, as it becomes a low impedance path to ground. The transient suppression capacitor ($C_t$) 264 and the Zener diodes 262 are not critical for the operation of the self-sensing circuit, as long as the transducer remains fully functional. Thus, the voltage suppression module (260) is not required for the operation of the self-sensing circuit as long as the transducer remains fully functional.

Using the configuration of the system 200 in FIG. 2, the capacitance of the electrostatic transducer 220 may be calculated by choosing the AC low voltage sensing signal ($V_{net}$), measuring the voltage across the measurement resistor ($V_m$), and calculating the phase difference between $V_{net}$ and $V_m$ using a Discrete Fourier Transform algorithm. In turn, the capacitance of the transducer 220 may be calculated using AC signal analysis. The net current output from the AC wave generator, $I_{net}$, is the same as the current drawn by the measurement resistor, $I_m$, and equals the sum of currents through the transient suppression capacitor ($I_t$) and the transducer ($I_a$) using Eq. 1:

$$I_{net} = I_m = I_t + I_a \qquad [\text{Eq. 1}]$$

It is assumed that the transducer has infinitely large parallel resistance ($R_p$) given the characteristic of the dielectric portion; therefore, the current through the transducer ($I_a$) does not include the current through the parallel resistance ($R_p$). Similarly, the net voltage, $V_{net}$, equals the sum of the voltage drop across the measurement resistor ($V_m$) and the voltage suppression capacitor ($C_t$), which is also the junction voltage ($V_j$) as reflected in Eq. 2:

$$\overrightarrow{V_{net}} = \overrightarrow{V_m} + \overrightarrow{V_j} \qquad [\text{Eq. 2}]$$

Using Ohm's law, the relationship between the voltage across the measurement resistor ($R_m$) and the impedance of the transducer ($Z_{ca}$) may be calculated using Eq. 3:

$$\frac{\|V_m\|}{R_m} = \frac{\|V_j\|}{Z_t} + \frac{\|V_a\|}{Z_a} \qquad \text{[Eq. 3]}$$

From Eqs 1-3, the capacitance of the electrostatic transducer ($C_a$) may be calculated. Specifically, knowing the net voltage ($V_{net}$), the voltage across measurement resistor ($V_m$), and the phase difference ($\theta$) therebetween, the junction voltage ($V_j$) may be calculated using Eq. 4:

$$V_j = \sqrt{V_{net}^2 + V_m^2 - 2V_{net}V_m\cos(\theta)}, \qquad \text{[Eq. 4]}$$

where $V_j$ is the voltage at the circuit junction connecting the measurement resistor ($R_m$), the transducer 220, and the voltage suppression capacitor ($C_t$). The angle between the voltage drop across the measurement resistor ($R_m$) and the junction voltage ($V_j$) may then be described using Eqs. 5 and 6:

$$\varphi = \pi - \Psi \qquad \text{[Eq. 5]}$$

$$\Psi = \sin^{-1}\left(\frac{V_{net}}{V_j}\sin(\theta)\right) \qquad \text{[Eq. 6]}$$

where $\Psi$ is the angle between the current through the measurement resistor ($R_m$) and the junction voltage ($V_j$). The angle between the current through the power supply filtering capacitor and the current through the measurement resistor is described using Eq. 7:

$$\zeta = \frac{\pi}{2} - \Psi \qquad \text{[Eq. 7]}$$

The currents through the measurement resistor ($I_m$), the voltage suppression capacitor ($I_t$), and the electrostatic transducer ($I_a$) are described with Eqs. 8, 9 and 10:

$$I_m = \frac{V_m}{R_m} \qquad \text{[Eq. 8]}$$

$$I_t = V_j(2\pi C_t f) \qquad \text{[Eq. 9]}$$

$$I_a = \sqrt{I_m^2 + I_t^2 - 2I_m I_t \cos(\theta)} \qquad \text{[Eq. 10]}$$

where f is the frequency of the AC wave generator (Hz) and $C_t$ is the voltage suppression capacitor (F).

From Eqs. 7, 9, and 10, the angle between $I_m$ and $I_a$ can be described using Eq. 11:

$$\chi = \sin^{-1}\left(\frac{I_t}{I_a}\sin(\zeta)\right) \qquad \text{[Eq. 11]}$$

From Eqs. 7 and 11, the angle $\alpha$ between $I_a$ and $V_j$ is then described by Eq. 12:

$$\alpha = \frac{\pi}{2} - \zeta - \chi \qquad \text{[Eq. 12]}$$

Because current through the transducer 220 is the same as current through the high voltage DC-DC converter of the high voltage power supply unit 230, the amplitude of the AC voltage at the high voltage DC-DC converter's output line ($V_o$) is described by Eq. 13:

$$V_o = I_a\left(\frac{R_{pp}\sqrt{R_{ps}^2 + Z_c^2}}{R_{pp} + \sqrt{R_{ps}^2 + Z_c^2}}\right) \qquad \text{[Eq. 13]}$$

where $R_{ps}$ is the estimated series resistance of the high voltage DC-DC converter ($\Omega$), $R_{pp}$ is the estimated parallel resistance of the high voltage DC-DC converter ($\Omega$), and $Z_c$ is the impedance of the voltage filtering capacitor $C_f$ ($\Omega$).

The angle between the AC voltage at the high voltage DC-DC converter's output line ($V_o$) and voltage across the high voltage filtering capacitor ($V_c$) is given by Eq. 14:

$$\gamma = \tan^{-1}\left(\frac{R_{ps}}{Z_c}\right) \qquad \text{[Eq. 14]}$$

The angle between the current through the series resistance of the high voltage DC-DC converter ($I_{ps}$) and the voltage drop across the high voltage filtering capacitor ($V_c$) is described by Eq. 15:

$$\omega = \frac{\pi}{2} - \gamma \qquad \text{[Eq. 15]}$$

Because $V_o = V_{pp}$, the current through $R_{pp}$ is found using Eq. 16:

$$I_{pp} = \frac{V_o}{R_{pp}} \qquad \text{[Eq. 16]}$$

From Eqs. 10, 15, and 16 the angle between the voltage at the high voltage DC-DC converter's output line ($V_o$) and the net voltage, $V_{net}$, is described using Eq. 17:

$$\rho = \omega - \sin^{-1}\left(\frac{I_{pp}}{I_a}\sin(\pi - \omega)\right) \qquad \text{[Eq. 17]}$$

The angle between the AC voltage at the high voltage DC-DC converter's output line ($V_o$) and the junction voltage ($V_j$) is described by Eq. 18:

$$\eta = \rho - \alpha \qquad \text{[Eq. 18]}$$

The voltage drop across the electrostatic transducer ($V_a$) is described using Eq. 19:

$$V_a = \sqrt{V_j^2 + V_o^2 - 2V_j V_o \cos(\eta)} \qquad \text{[Eq. 19]}$$

The angle between the voltage drop across the transducer and the current through it is described using Eq. 20:

$$\beta = \alpha - \sin^{-1}\left(\frac{V_o}{V_a}\sin(\eta)\right) \qquad \text{[Eq. 20]}$$

The impedance of the capacitance of the electrostatic transducer is found using Eq. 21:

$$Z_{ca} =$$

$$\frac{\frac{V_a}{I_a}\sin(\beta)\left(\frac{1}{\tan(\beta)^2}+1\right)}{2} + \frac{\sqrt{\frac{V_a^2}{I_a^2}\sin(\beta)^2\left(\frac{1}{\tan(\beta)^2}+1\right)^2 - 4R_S^2}}{2} \qquad \text{[Eq. 21]}$$

where $R_s$ is the electrode resistance of the transducer 220 as described above. The self-sensing capacitance is therefore found using Eq. 22:

$$C_a = \frac{1}{2\pi Z_{ca}f} \qquad \text{[Eq. 22]}$$

where $Z_{ca}$ is the impedance of the variable capacitance of the electrostatic transducer ($\Omega$) as calculated using Eq. 21, $C_a$ is the variable capacitance of the electrostatic transducer (F), f is the frequency of the AC wave generator (Hz), $V_a$ is the voltage drop across the electrostatic transducer (V), $I_a$ is the current across the electrostatic transducer (A), $R_s$ is the electrode resistance of electrostatic transducer ($\Omega$); and B is the calculated phase lead between $I_a$ and $V_a$ (Rads).

Examples

To realize the self-sensing system, a direct digital synthesizer (AD9833, Linear Technology) is chosen to generate and deliver a 540-mV sinusoidal wave at 1 kHz to the self-sensing system shown in FIG. 2. An inverting operational amplifier (LT1037, Linear Technology) with a gain of 1:33.3 amplifies the signal to 24 V peak-to-peak. An instrumentation amplifier (INA129, Texas Instruments) is used to measure the voltage across the measurement resistor ($R_m$). The measured voltage output is attenuated 10:1, passed through a $2^{nd}$ order low-pass filter with a 10 kHz corner frequency to filter the high voltage ripple from the high voltage amplifier, and level-shifted by +1.25 V. Since the integrated analog-to-digital converter (ADC) of the microcontroller 210 (MK66FN2MOVLQ18, NXP) can only accept 0-2.5 V, a signal conditioning circuit 246 is used to scale the voltage across the measurement resistor ($R_m$) into a measurable range for the microcontroller 210. A 220-pF transient suppression capacitor ($C_t$) is chosen to help the self-sensing circuit function well with a Trek 50/12 high voltage amplifier (Trek, Inc.) that has a maximum slew rate of 350 V/µs. The system and components described in this example can reliably sense the capacitance ($C_a$) even with a step high voltage input at 10 kV.

Also implemented is a bidirectional Zener diode 262 (DDZ9713S-7, Diodes Incorporated) setup as shown in suppression module 260. In the event of high voltage discharge in the transducer (e.g., through dielectric breakdown), the Zener diode 262 protects several components connected to the junction ($V_j$) from a sudden voltage increase. In this example, the self-sensing unit 240 provides a significant cost efficiency using readily available parts. This makes the presented self-sensing system 200 a simple, versatile, cost effective, and compact system for sensing capacitance in electrostatic transducers 220.

Figure 3:
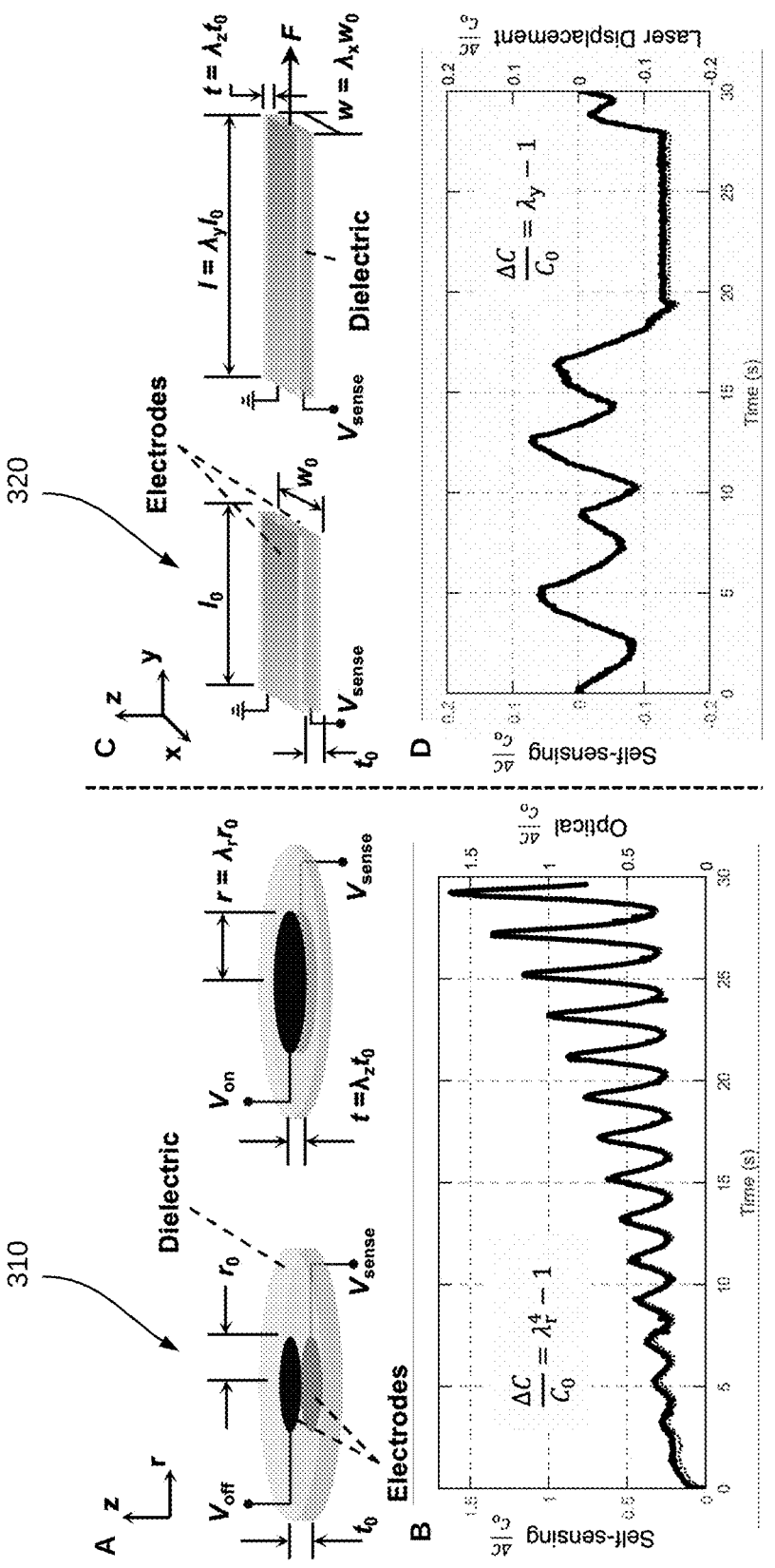
FIG. 3 depicts an example of self-sensing of a DEA and a stretchable capacitive sensor with sensed versus externally measured displacements for each arrangement, in accordance with aspects of this disclosure.

The self-sensing system 200 performs well for a variety of soft electrostatic transducers and sensors. The performance of the system 200 was validated for an example of a DEA and a capacitive stretchable sensor and results are shown in FIG. 3. FIG. 3 also presents self-sensing results to theoretical capacitance changes calculated from geometric models of each transducer.

With respect to the example employing the DEA, the basic structure of a DEA 310 includes an elastomeric dielectric layer that is sandwiched between stretchable electrodes. When a high voltage signal ($V_{on}$) is applied to a first (e.g., a top) electrode, electrostatic forces cause the dielectric to decrease in thickness, from $t_0$ to t, and expand in area as a function of the increase of electrode radius from $r_0$ to r. Circular DEAs, as shown in Portion A of FIG. 3 on the left-hand side, are a common shape because the axisymmetric expansion that occurs during actuation is uniform and convenient to characterize. The relative change in capacitance, $\Delta C/C_0$, is related to the stretch of the DEA, $\lambda_r$, in the radial direction as described in Eq. 23:

$$\frac{\Delta C}{C_0} = \frac{C - C_0}{C_0} = \lambda_r^4 - 1 \qquad \text{[Eq. 23]}$$

The performance of a self-sensing system with a DEA is verified by measuring the self-sensing capacitance while simultaneously recording radial stretch using a Canon EOS 6D DSLR camera recording at 60 frames per second. The resulting video files were processed using a custom MATLAB program to measure actual displacement.

The DEA 310 was made from an acrylic elastomer (VHB 4910, 3M) that was pre-stretched radially 2.2 times ($\lambda_r$=2.2) onto an acrylic ring. Then carbon grease electrodes were painted onto either side of the dielectric (846, MG Chemicals). The electrode diameter was approximately 20 mm (corresponding to an initial radius $r_0$ of approximately 10 mm). The actuation signal for the DEA 310 was a sinusoidal waveform with constant frequency (0.5 Hz) and increasing amplitude (i.e., from approximately 0-4.4 kV).

FIG. 3, Portion B on the lower left-hand side shows the relative change in capacitance as calculated using the image data (labeled "Optical") plotted as a dotted line along with capacitance measured as using a self-sensing system as described above as a solid line (labeled "Self-sensing"). The capacitance measured with the self-sensing system overlaps with the relative change in capacitance based on optical measurements, showing good agreement between the two methods with a root mean square error (RMSE) of 0.0299.

In another example, illustrated in Portion C of FIG. 3, a stretchable rectangular parallel-plate capacitive sensor 320 is used to demonstrate the self-sensing capabilities of a self-sensing system as described above in the absence of a high voltage power supply. The relative change in capacitance, $\Delta C/C_0$, is linearly related to stretch in the y-direction, $\lambda_y$, for the capacitive sensor 320 as described in Eq. 24:

$$\frac{\Delta C}{C_0} = \lambda_y - 1 \qquad \text{[Eq. 24]}$$

To verify that the self-sensing system described above works with a stretchable sensor, a soft 1×4 cm rectangular parallel-plate capacitor 320 was fabricated using 500 μm EcoFlex 00-30 for the dielectric and silver knitted fabric (Medtex P130, V Technical Textiles, Inc.) for the electrodes. The sensor, pre-stretched to $I_0$=6.5 cm, was fixed at one end and the other end was mounted to a linear bearing so that the stretch was constrained only to the y-direction. Thus, in the test configuration, $w_0$ is equal to w and $\lambda_y$=1. A force, F, was applied to manually stretch the sensor in a random pattern. When the force, F, was applied, thickness of the sensor 320 decreased from $t_0$ to t and length of the sensor increased from $I_0$ to I. Capacitance was measured using a self-sensing system as described herein and simultaneously the length of the sensor was measured using a laser displacement sensor (LK-H157, Keyence Corp.).

The results of the example are presented in FIG. 3 at Portion D, which shows relative change in capacitance of the sensor 320 with application of various amounts of force, F. The relative change in capacitance calculated using measured displacement is shown in dotted line and the sensed relative change in capacitance as measured using the self-sensing system is shown in solid line. The capacitance measured with the self-sensing system overlaps with the relative change in capacitance based on laser displacement measurements, showing good agreement between the two methods with an RMSE of 0.0048.

The performance of the self-sensing systems described herein was also examined in relation to a HASEL actuator. Unlike DEAs and parallel-plate capacitive stretch sensors, HASEL actuators have more complex geometries, heterogeneous multiphase structures, and they can exhibit certain types of instabilities in actuation, which complicates the mathematical calculation of displacements with respect to changes of capacitance. Therefore, a calibration procedure is performed to map the displacement of the HASEL actuators and the change of their capacitances.

Figure 4:
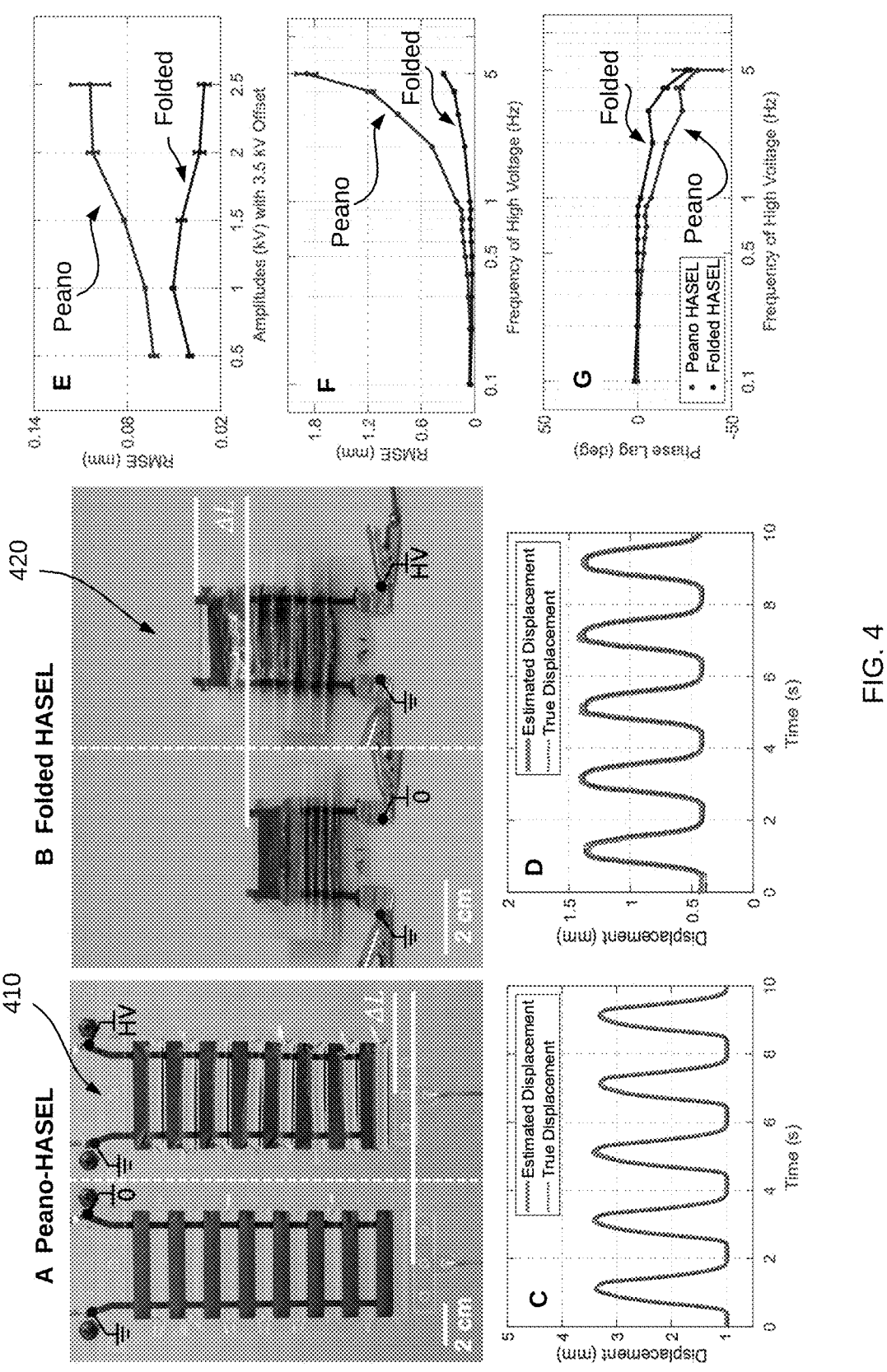
FIG. 4 depicts an example of characterization of self-sensing for two types of HASEL actuators, in accordance with aspects of this disclosure.

With further reference to FIG. 4, self-sensing calibration of a self-sensing system (e.g., using a displacement determination unit 150 as shown in FIG. 1) is dependent on the high voltage power supply unit 130 and the transducer 120 being used. The self-sensing calibration in this example was performed using a Trek 50/12 high voltage amplifier with two types of HASEL actuators: a linearly-contracting Peano-HASEL actuator 410 shown in Portion A of FIG. 4 having eight pouches connected in series, and a linearly-expanding folded-HASEL actuator 420 shown in Portion B of FIG. 4 having eleven pouches folded into a stack. Fabrication details for both types of HASEL actuators are generally provided in the materials incorporated by reference herein.

Figure 5:
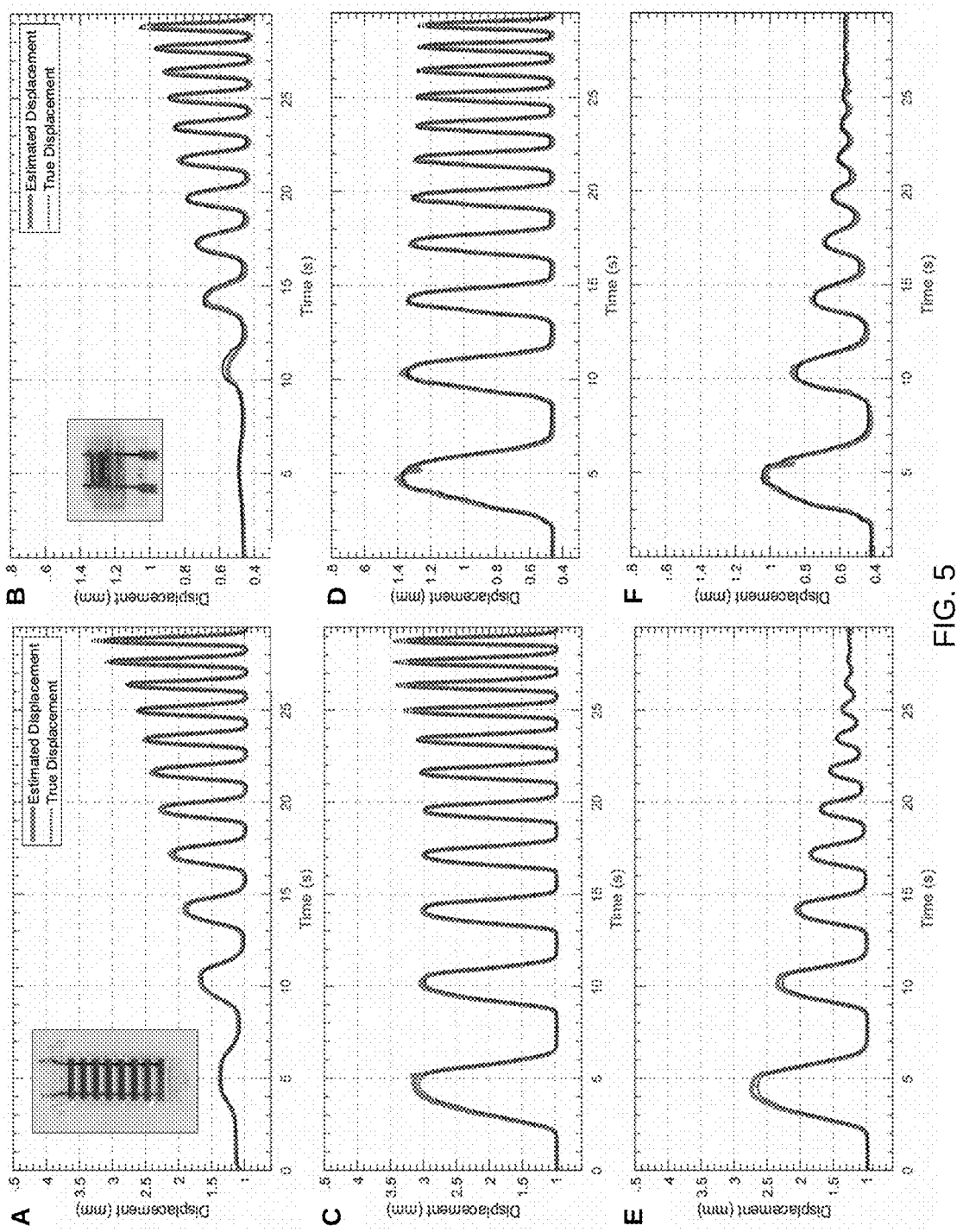
FIG. 5 depicts examples demonstrating validation of self-sensing for a Peano-HASEL actuator and a folded-HASEL actuator with sensed displacement plotted relative to externally measured displacements for each arrangement, in accordance with aspects of this disclosure.

The calibration procedure contains two parts: offline characterization as illustrated in FIG. 4 in which the self-sensing data are collected then later analyzed, and real-time validation as shown in FIG. 5, in which the displacements of the HASEL actuators are estimated based on real-time analysis of the self-sensing capacitance data from a self-sensing system.

In the offline characterization, the calculated capacitances of the Peano-HASEL actuator 410 with a 200 g load and folded-HASEL actuator 420 with a 150 g load are synchronized with both laser (true) displacement data (obtained using a LK-H157, Keyence Corp.) and the high voltage drive signal applied. The estimated displacements of the HASEL actuators 410, 420 are calculated using a second order polynomial fitting function (using MATLAB R2019b, MathWorks). The function is obtained from the total self-sensing capacitance data and the true displacement data that are collected from two set of experiments: one with sinusoidal high voltage frequencies from 0.1 Hz to 5 Hz, with 2.5 kV amplitude and 3.5 kV offset and the other with sinusoidal high voltage frequency at 0.5 Hz, with 0.5 kV to 2.5 kV amplitude and 3.5 kV offset. For each high voltage sine wave, the data are collected 10 times, with the error bars as one standard deviation from the mean of 10 repeated experiments.

As can be seen from FIG. 4, the self-sensing of the Peano-HASEL 410 and folded-HASEL actuators 420 using a Trek 50/12 shows good agreement between the estimated and true displacements shown in the graph in Portion C for the Peano-HASEL 410 and in the graph in Portion D for the folded-HASEL 420. The true displacements are shown in dotted line and estimated displacements are shown in solid lines in the entire high voltage amplitude range of interest in the plots in Portions C and D of FIG. 4. The overall RMSE between the estimated displacements and the true displacements is less than 0.14 mm with an average RMSE of 0.08 mm for a Peano-HASEL actuator 410 and 0.04 mm for a folded-HASEL 420 actuator as shown in Portion E of FIG. 4. Similarly, the self-sensing system described herein performs well for actuation frequencies up to 1 Hz, with RMSE values that are less than 0.20 mm for both actuators as shown in Portion F of FIG. 4.

Figure 9:
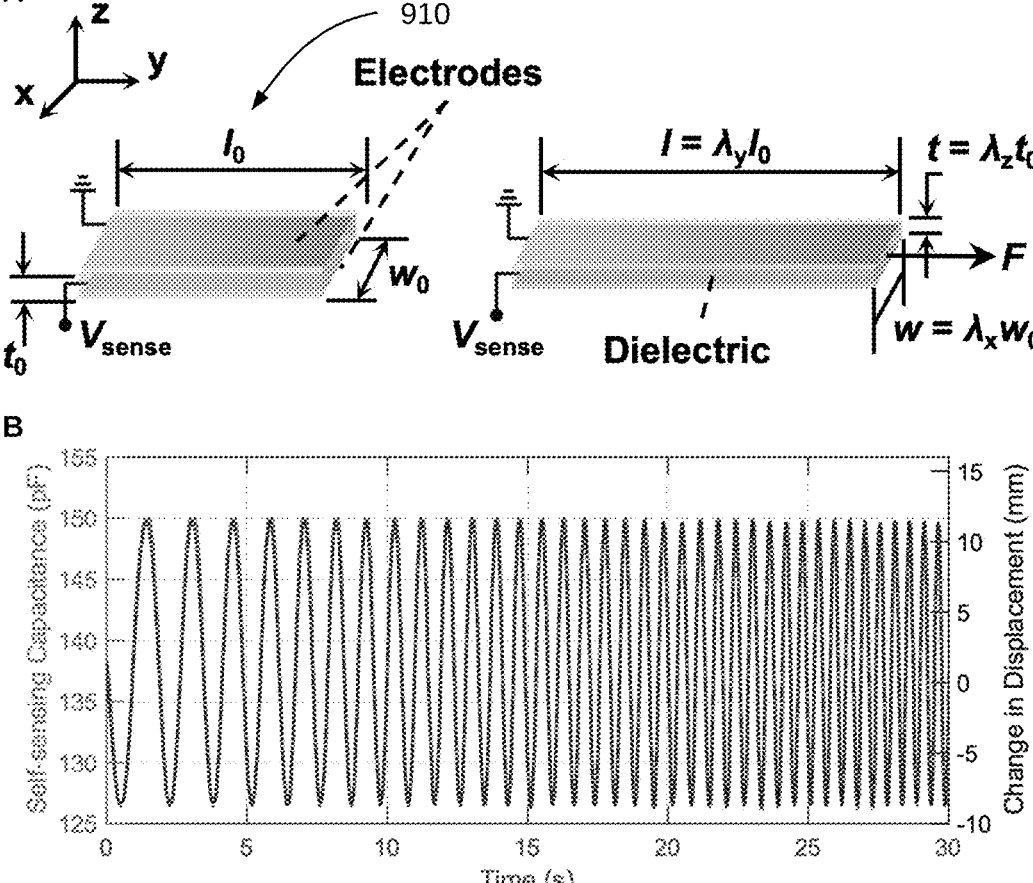
FIG. 9 depicts an example configuration and results for qualitative evaluation of phase lag between self-sensing capacitance and measured displacement of a stretchable capacitive sensor, in accordance with aspects of this disclosure.

In this example, a slow sensing rate of 96 Hz was utilized such that self-sensing worsens with high voltage frequencies beyond 1 Hz both in terms of RMSE (as shown in Portion F of FIG. 4) and the phase lag (as shown in Portion G of FIG. 4) between the change in self-sensing capacitances and the change in displacements. Further investigation was conducted, and results are reflected in FIG. 9 in relation to a stretchable sensor 910, similar to stretchable sensor 320, receiving a similar drive signal as utilized in FIG. 5, which will be described in detail below. The results in FIG. 9 suggest that the phase lag issue lies in the nature of the HASEL actuators, rather than the self-sensing system. The sinusoidal displacement for the parallel-plate stretchable capacitor 910 shown in FIG. 9, when receiving increasing frequencies from 0.5 Hz to 3 Hz, does not cause any phase lag between the change in self-sensing capacitances and relative change in theoretical capacitance using the self-sensing system described herein. It is contemplated that self-sensing may be improved by using a dedicated ADC with direct memory access (DMA) for much faster sampling rate (e.g., up to 1 MHz). This will allow the self-sensing sine wave frequency to increase to 10 kHz and may increase the capacitance update rate to approximately 1 kHz.

With the second order polynomial calibration function programmed in the displacement determination unit 150 shown in FIG. 1, a validation procedure was conducted to demonstrate the agreement between the true and estimated displacements of the Peano-HASEL 410 and folded-HASEL actuators 420 in real-time and results are shown in FIG. 5. For the Peano-HASEL actuator 410, the self-sensing system shows good agreement between the estimated displacement data shown in solid line and true displacement data shown in dotted line with RMSEs of 0.05 mm for a high voltage driving signal with both increasing amplitude and frequency (shown in Portion A of FIG. 5), 0.07 mm for a high voltage signal with constant amplitude and increasing frequency (shown in Portion C of FIG. 5), and 0.04 mm for a high voltage driving signal with decreasing amplitude and increasing frequency (shown in Portion E of FIG. 5). The percent errors are 1.81%, 1.95%, and 1.50%, respectively.

For the folded-HASEL actuator 420, the RMSEs between the estimated and true displacement data are 0.03 mm for a high voltage signal with both increasing amplitude and frequency (shown in Portion B of FIG. 5), 0.03 mm for a high voltage signal with constant amplitude and increasing frequency (shown in Portion D of FIG. 5), and 0.02 mm for a high voltage signal with decreasing amplitude and increasing frequency (shown in Portion F of FIG. 5). The percent errors are 3.33%, 3.36%, and 2.58%, respectively.

Figure 6:
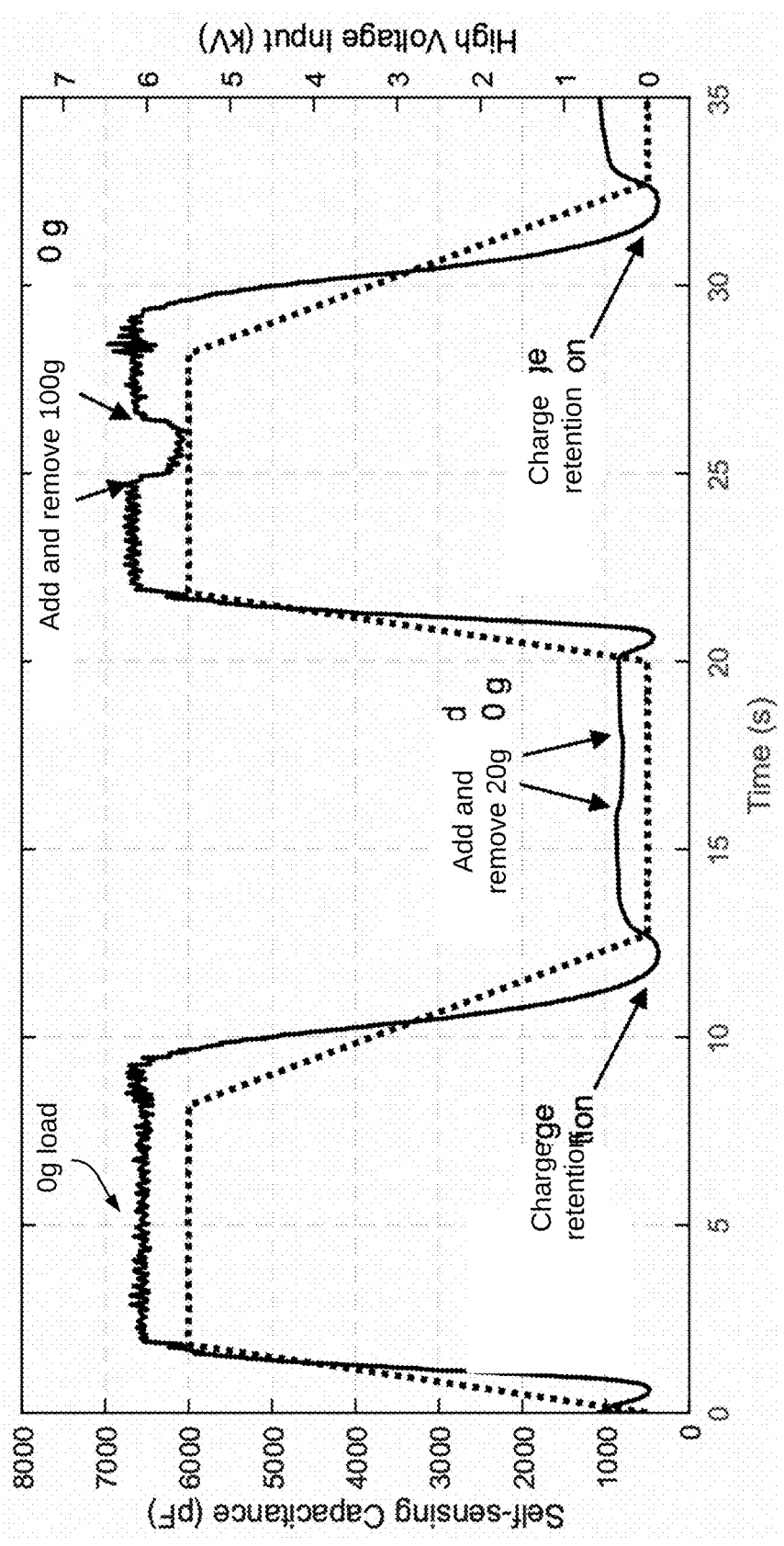
FIG. 6 depicts examples of self-sensing sensitivity with a Peano-HASEL actuator that shows sensed displacement both in response to an applied driving signal and externally applied forces acting on the actuator, in accordance with aspects of this disclosure.

To further qualitatively demonstrate the self-sensing sensitivity of self-sensing systems described herein, five cycles of a 0.05 Hz trapezoidal high voltage waveform from 0 kV to 5.5 kV were applied to a Peano-HASEL actuator with results shown in FIG. 6. In particular, the ability of the self-sensing system to detect the change in capacitance of the actuator under various types of disturbances can be seen in FIG. 6. The high voltage drive signal (illustrated as a dotted line) has an approximately 40 kHz ripple, and noise with frequencies from 0 Hz to 2 kHz. It is understood that the high voltage noise in the drive signal is dependent on the capacitive load of the system. Therefore, self-sensing with a high voltage drive signal has a sensitivity that is dependent on the high voltage values and the zipping state of the actuator. When there is no high voltage, the calculated capacitance (illustrated as a solid line) has a peak-peak noise of 1 pF, and the sensing system can detect a 20 g load. With a high voltage drive signal applied and 0 g load, the calculated capacitance values fluctuate with a 100-pF peak-peak noise, but the noise decreases to 50 pF when there is a 100 g load applied to the Peano-HASEL actuator.

Physical interactions such as pulling on the Peano-HASEL actuator also result in corresponding changes in capacitance. The self-sensing method is sufficiently robust to detect charge retention in the Peano-HASEL actuator, which occurs after applying high electric fields for a period of time and causes full actuator relaxation (lowest capacitance) at low voltages of ~1 kV, and a slight reactivation (e.g., contraction and slightly higher capacitance) at 0 kV.

In addition, a highly portable self-sensing system using a common high voltage DC-DC converter (EMCO C80, XP Power) with a Peano-HASEL actuator was demonstrated. The ability to use an unmodified, miniature converter having a major dimension of 8 cm rather than the high voltage power supply unit utilized in the foregoing validation, which had a major dimension of 1.5 m, for a self-sensing system demonstrates the advantages of the self-sensing system to facilitate portable, untethered high voltage soft robotic designs.

Figure 7:
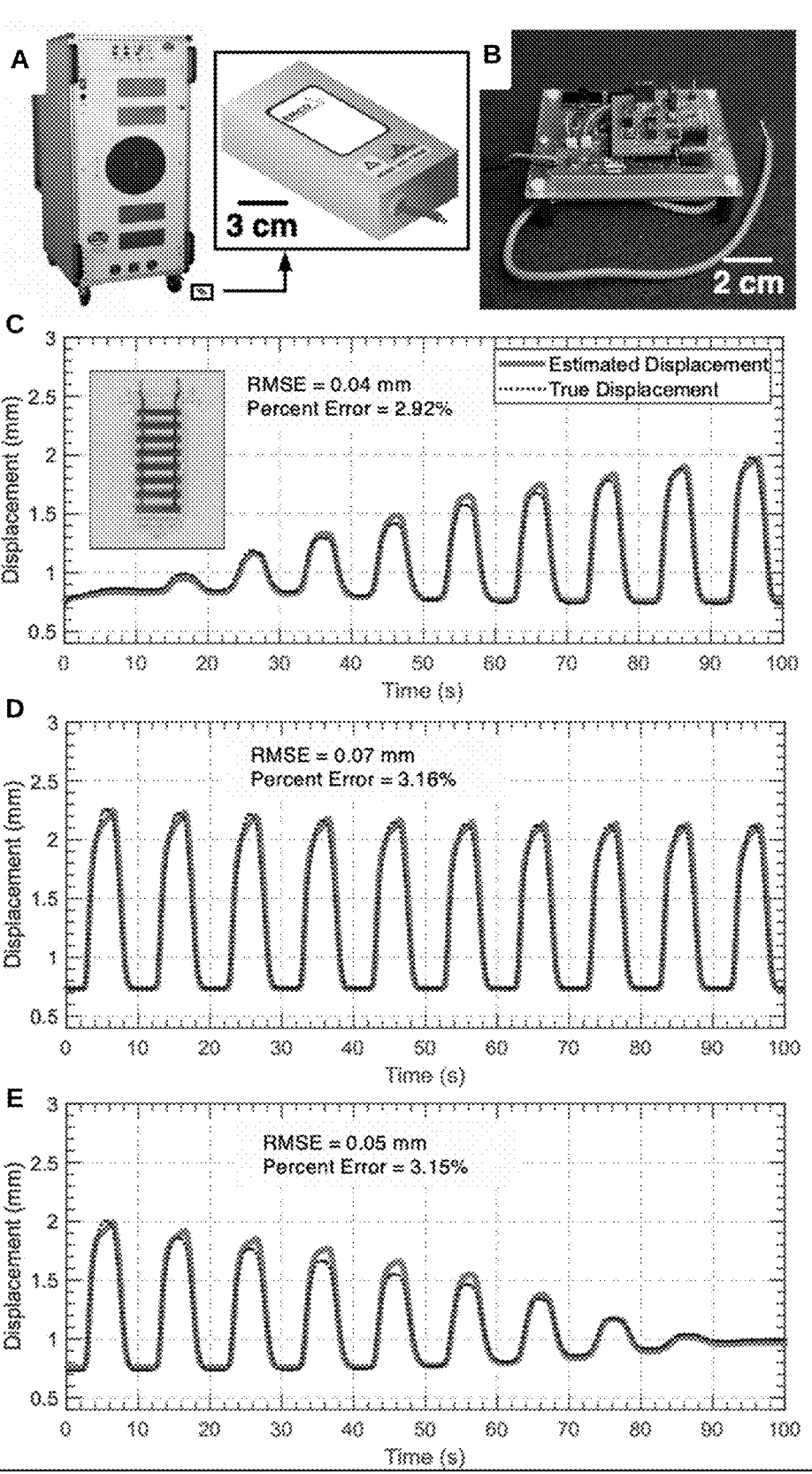
FIG. 7 depicts a specific example in which the self-sensing capability of the system described herein is realized with example hardware such as a miniature high voltage power supply unit that may be advantageous for compact, portable use, in accordance with aspects of this disclosure.

FIG. 7 shows the physical representation of the portable driving and self-sensing system. Portion A of FIG. 7 represents a 3D render of the EMCO C80 on the right with a Trek 50/12 on the left shown for comparison of size. Portion B of FIG. 7 shows a fully-integrated and miniaturized power and self-sensing circuit with EMCO C80 connected underneath (out of view). A driving sinusoidal high voltage waveform at 0.1 Hz was applied to the Peano-HASEL actuator 410 with increasing amplitude (0 kV to 1.5 kV), constant amplitude (1.5 kV) and decreasing amplitude (1.5 V to 0 kV) with 2.3 kV offset. The choice of high voltage amplitudes and frequencies provides visualization of self-sensing system performances within the high voltage range of interest when using the EMCO C80 converter. The lower bound and upper bound of the high voltage signal account for the actuators' activation voltage around 1 kV and the distortion of the self-sensing signal at 3.3 kV. The offline estimated displacements—based on a $2^{nd}$ order polynomial fitting function for the three cases of high voltage waveforms using the approach described above—are captured and shown in Portions C-E of FIG. 7. As shown in Portion E of FIG. 7, the self-sensing capacitance is slightly distorted for high voltage signals above 3.3 kV when using the EMCO C80 instead of the Trek 50/12. One explanation may be that the increase of the high voltage drive signal beyond 3.3 kV results in larger interfering noise at the same frequency but out of phase with the sensing signal. The cancelation of the high voltage output noise and the self-sensing sine wave results in the distorted capacitance readouts. This issue may be mitigated significantly by increasing the amplitude of the self-sensing waveform to increase the signal-to-noise ratio. However, the miniature self-sensing (solid line) and true (dotted line) displacements still agree well as indicated by the RMSE of 0.04 mm (2.92% error), 0.07 mm (3.16% error), and 0.05 mm (3.15% error) for the high voltage waveforms with increasing amplitude, constant amplitude, and decreasing amplitude, respectively.

In another experiment, the ability to track a variety of displacement reference waveforms using a proportional-integral-derivative (PID) controller with the calibrated self-sensing displacements as feedback is demonstrated.

A robotic arm driven by two Peano-HASEL actuators lifting a 20-g load was provided. The self-sensing capacitance (solid line) and displacement (dotted line) calibration results for this specific configuration are shown in Portions A-C of FIG. 8. The closed-loop controller has a frequency of approximately 90 Hz. The real-time estimated self-sensing displacement is filtered by a first-order low-pass digital filter with 5 Hz corner frequency. The PID controller was tuned experimentally; the chosen proportional, integral, and derivative gains are: $K_P=0.045$, $K_I=0.9$, and $K_D=0.001$. The PID algorithm computed the desired high voltage value to reduce the errors between the target displacements and the self-sensing displacements. This high voltage value was mathematically scaled down by a factor of 1/5000 so that it could be generated by a low voltage digital-to-analog converter (DAC) from the microcontroller. The scaled analog output voltage was then amplified by the Trek 50/12 with an amplification of 1:5000, thus generating a proper high voltage value to adjust the robotic arm's displacements.

Figure 8:
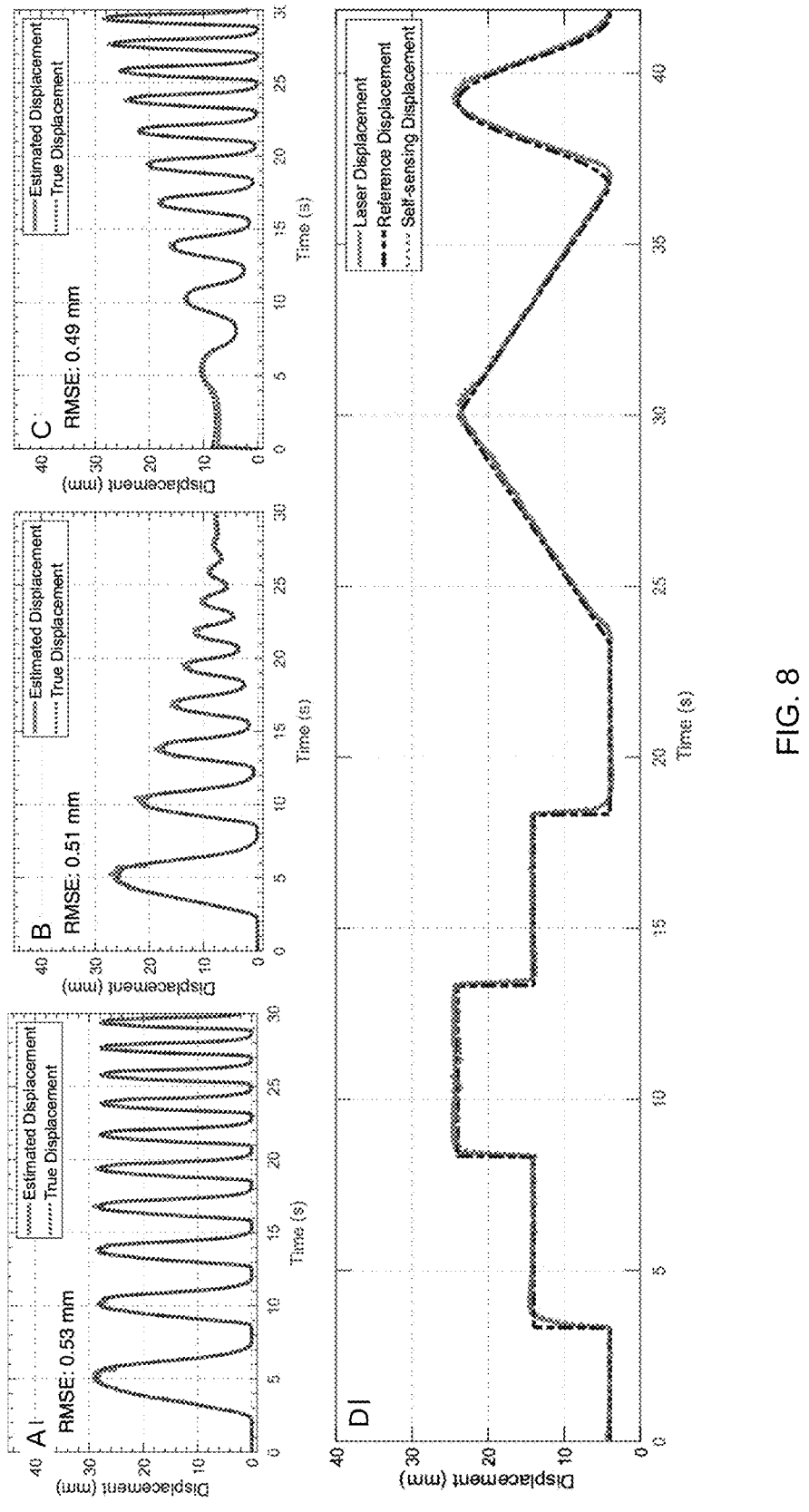
FIG. 8 depicts an example characterization of self-sensing for a robotic arm driven by two Peano-HASEL actuators, in accordance with aspects of this disclosure.

Portion D of FIG. 8 shows a typical tracking performance of the closed-loop system with respect to three displacement targets: steps, ramp, and sine waveforms. The tracking performance is satisfactory with 1.00% and 1.70% steady state errors between the true displacement (solid line) and the target displacement (dash-dot line) at 16 mm, 24 mm steps, respectively. Self-sensing results are illustrated in dotted lines. The controller has excellent rise times of 267 ms and 100 ms for a 4-to-16-mm step and a 16-to-24-mm step, respectively. The corresponding fall times are slightly worse with 340 ms and 120 ms for a 16-to-4-mm step and 24-to-16-mm step, respectively. The asymmetric step responses of the HASEL arm can be explained by the asymmetric activation and relaxation characteristics of the Peano-HASEL actuators. The activation process is an active force application process due to the high voltage drive signal being applied directly to the dielectric liquid via the electrode zipping. In contrast, relaxation is a passive restoration process where the electrodes unzip as the result of the viscoelastic return flow of the FR3 dielectric liquid and the lack of electrostatic force. The ramp tracking result is satisfactory with small errors of 3.97% when a high voltage drive signal is increasing and 3.56% when the high voltage drive signal is decreasing. The sine tracking at 0.2 Hz is also good with 7.92° phase lag between the true displacement and the target displacement. Overall, the self-sensing circuit has proven its capability for controlling high voltage electrostatic transducers.

Figure 10:
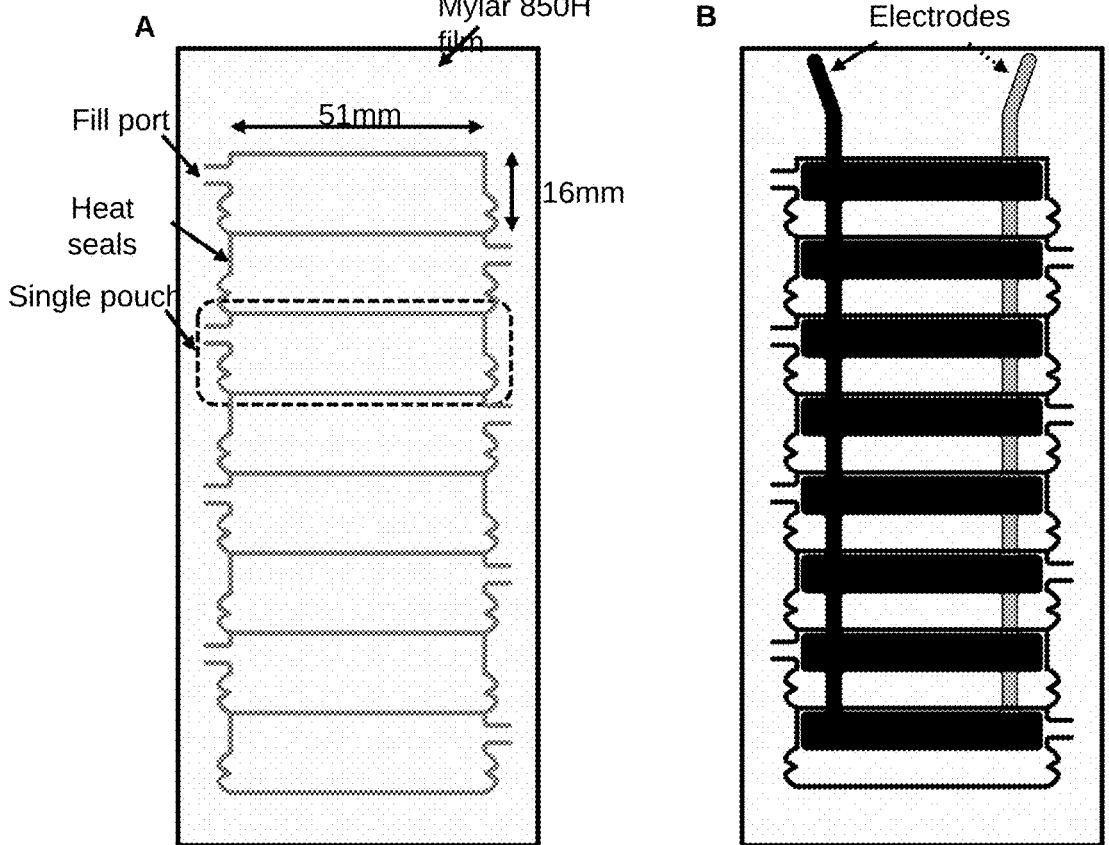
FIG. 10 depicts an example of a simplified representation of a Peano-HASEL actuator, in accordance with aspects of this disclosure.
Figure 11:
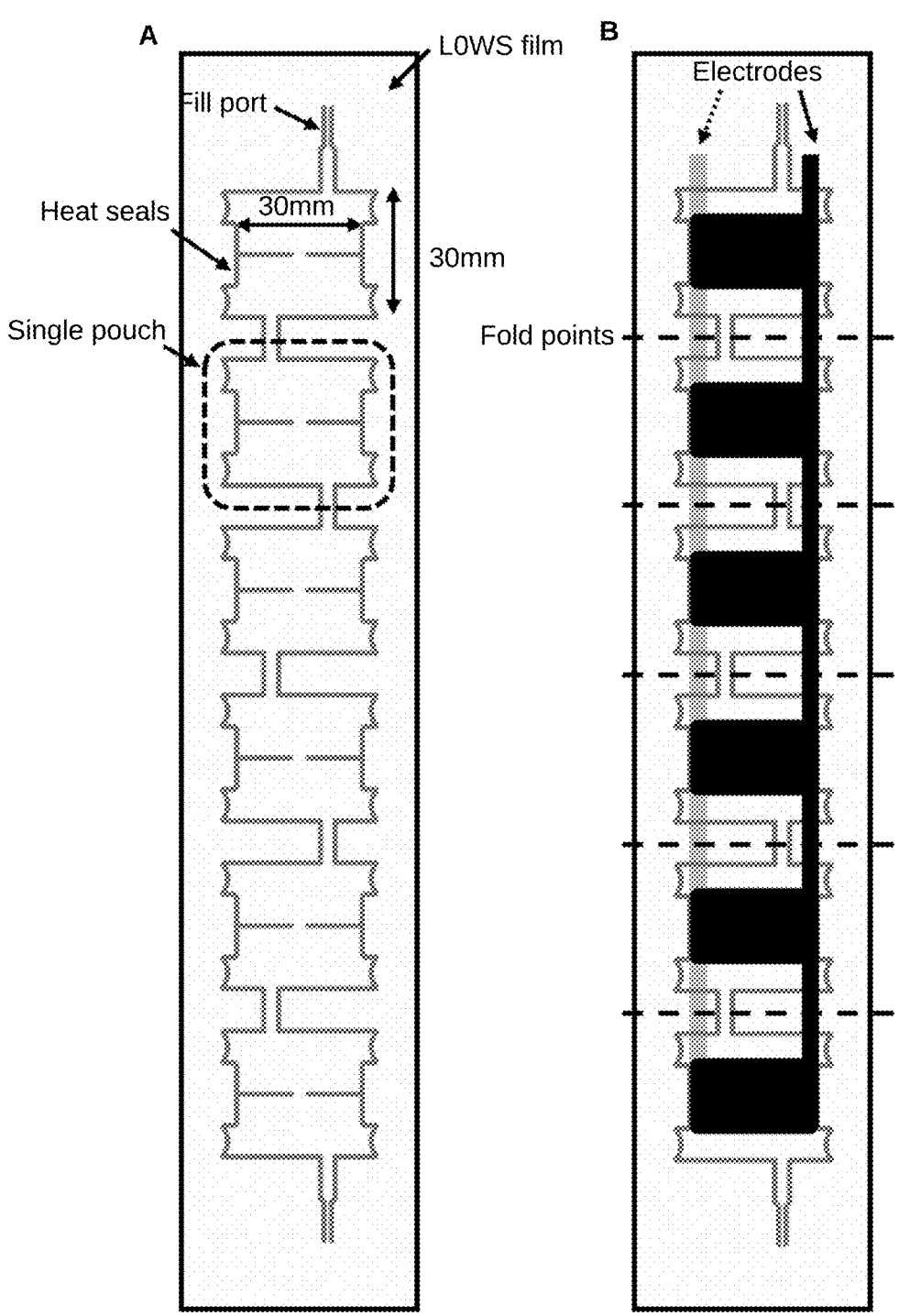
FIG. 11 depicts a simplified representation of a folded-HASEL actuator, in accordance with aspects of this disclosure.

FIGS. 10 and 11 illustrate example configurations of a HASEL actuator according to the foregoing examples. Specifically, Portion A of FIG. 10 shows a simplified representation of the Peano-HASEL actuator including a schematic of the heat-seal pattern used in the Peano-HASEL actuators showing all eight discrete pouches with example dimensions. Portion B of FIG. 10 illustrates that electrodes may be screen-printed onto the discrete pouches such that the electrodes cover the top half of each pouch on both sides of the actuator. Small leads at the top of the series of pouches allow for external electrical connections to the actuator.

FIG. 11 shows a representation of a folded-HASEL actuator (only six pouches are shown in the figure for simplicity). Portion A of FIG. 11 includes a schematic of the heat-seal pattern used in the folded-HASEL actuators showing an example of six pouches with example dimensions. All pouches may be initially connected to facilitate filling with liquid dielectric. As shown in Portion B of FIG. 11, electrodes may be screen-printed such that they cover the middle of each pouch on both sides of the actuator. Small leads at the top allow for external electrical connections to the actuator.

he system 200 described in FIG. 2 illustrates one example transducer with self-sensing configuration. FIGS. 12-16 illustrate alternative examples of transducer systems having self-sensing configurations, some of which may include voltage suppression modules, voltage suppression components, and/or configurations with alternative paths to ground.

Figure 12:
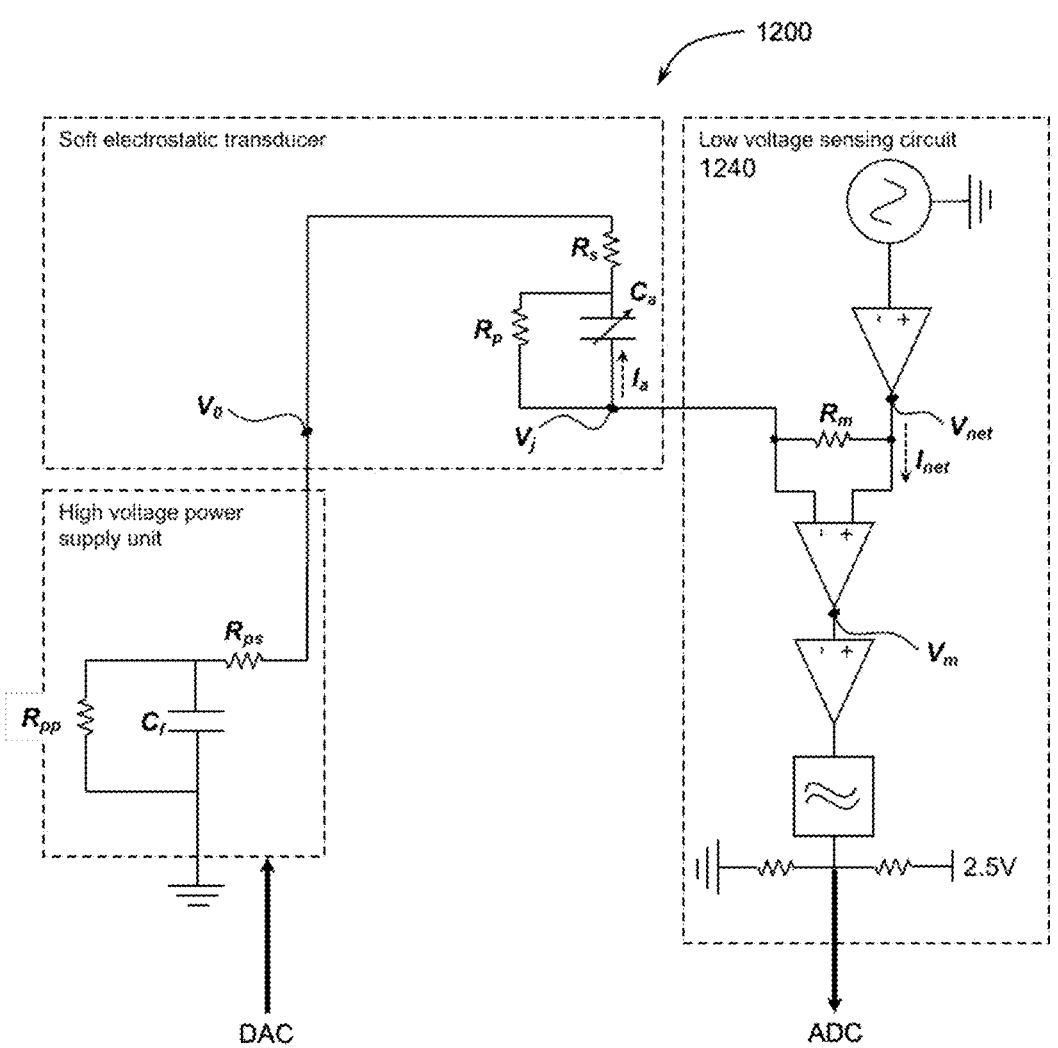
FIG. 12 depicts an alternate example self-sensing system without a separate high voltage suppression module other than the electrostatic transducer itself, in accordance with aspects of this disclosure.

FIG. 12 shows an example of transducer system 1200 with a self-sensing system 1240. The transducer system 1200 does not include a voltage suppression module; rather, the system 1200 relies on the electrostatic transducer itself to protect the low voltage self-sensing circuitry from high voltage, such as transient high voltages that may occur when turning the voltage on quickly. Such a configuration may be possible if the electrostatic actuator is well-designed and the self-sensing method operates reliably even without the voltage suppression capacitor and the Zener diode pair. Such a modification may allow the system 1200 to be even more compact compared to systems including a voltage suppression module and may allow the low voltage sensing unit to be integrated directly on the low voltage side of the electrostatic actuator.

Figure 13:
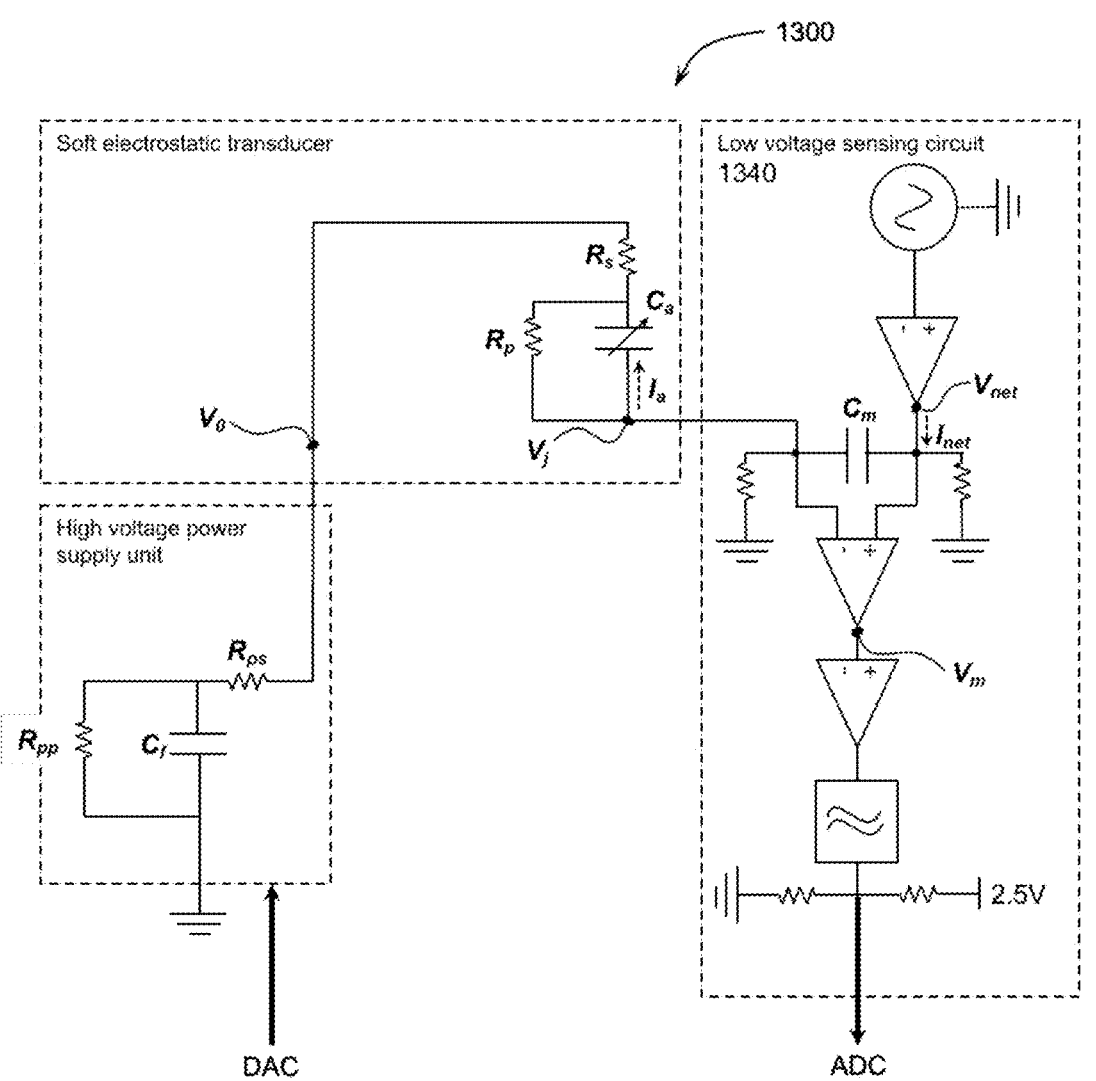
FIG. 13 depicts an alternate example of a self-sensing system that utilizes a measurement capacitor, in accordance with aspects of this disclosure.

FIG. 13 illustrates a transducer system 1300 having a self-sensing system 1340 with measurement capacitor $C_m$ in place of measurement resistor $R_m$. In this regard, the self-sensing system described herein also works well with a measurement capacitor instead of a measurement resistor. That is, the sensing component of the low voltage self-sensing system 1340 may be a sensing resistor or a sensing capacitor. Although not illustrated, system 1300 may also include a voltage suppression module as discussed with respect to FIG. 2 above.

Figure 14:
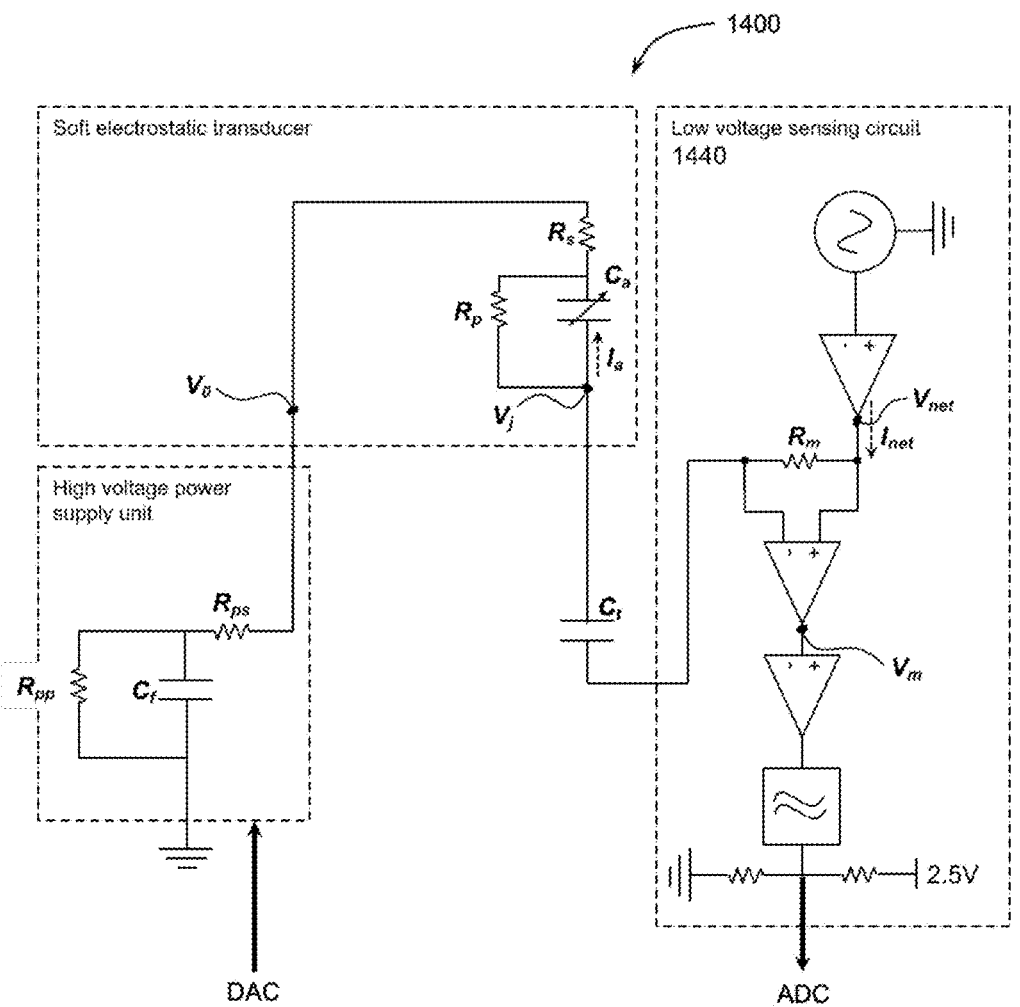
FIG. 14 depicts an alternate example of a self-sensing system in which the high voltage suppression module comprises a series high voltage suppression capacitor, in accordance with aspects of this disclosure.

FIG. 14 shows a transducer system 1400 having a self-sensing system 1440. The transducer system 1400 includes a voltage suppression capacitor $(C_t)$ in series with the self-sensing system 1440. In this example, $C_t$ is not connected to the ground but is connected to the measurement resistor. With $C_t$ much larger than the maximum value of $C_a$, the capacitor can act as a small impedance component in AC analysis, but it effectively prevents high voltage from damaging the low voltage sensing components in the event of electrical failure of the electrostatic transducers. This allows high voltage protection with or without the Zener diode pair.

This voltage suppression capacitor configuration may be employed with either example of a measurement resistor or a measurement capacitor.

Figure 15:
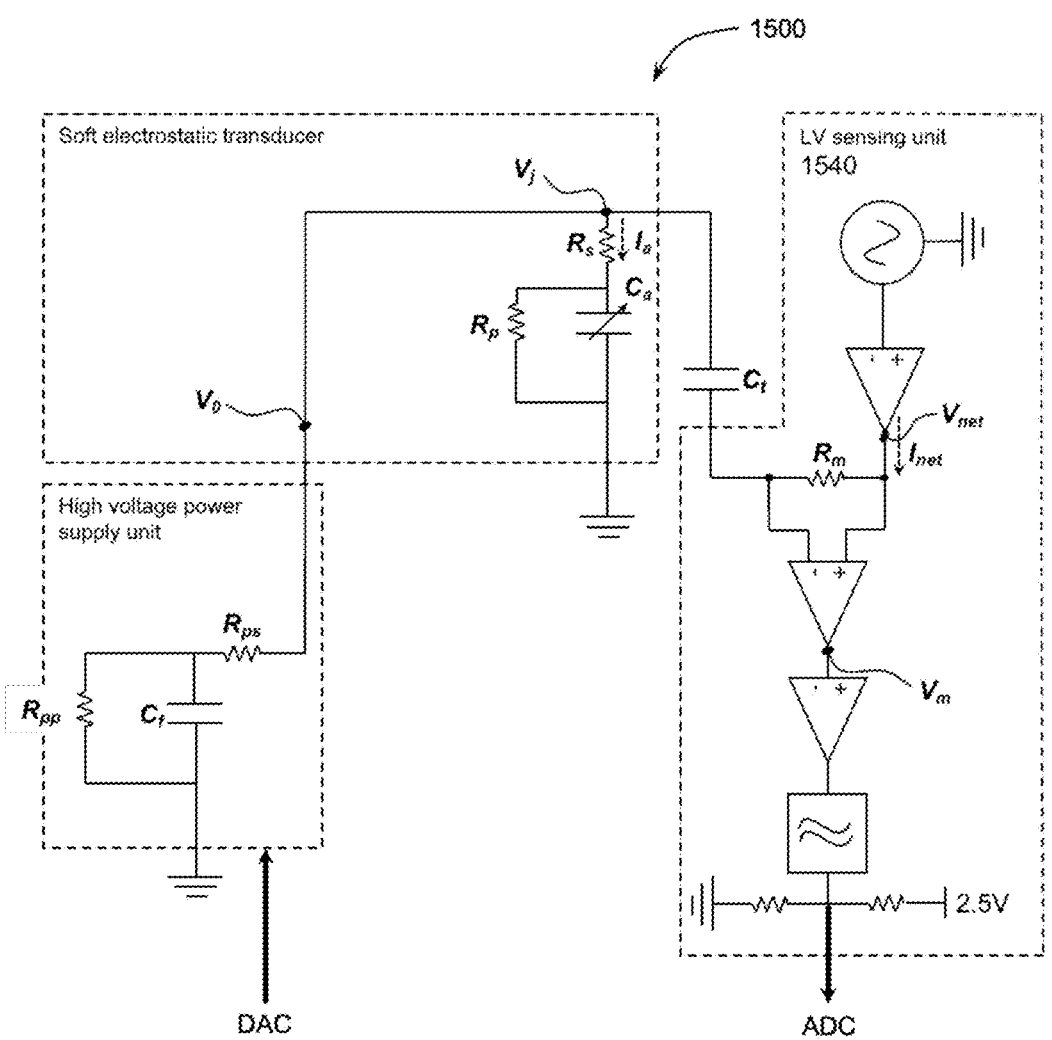
FIG. 15 depicts an alternate example of a self-sensing system in which the high voltage suppression module comprises a high voltage protection capacitor arranged in parallel with the transducer, in accordance with aspects of this disclosure.

FIG. 15 illustrates a transducer system 1500 having a self-sensing system 1540 and a high voltage suppression capacitor $C_t$ in parallel. The high voltage suppression capacitor $C_t$ can be placed in series with the measurement resistor $R_m$ and in parallel with the electrostatic transducer to protect the self-sensing components without relying on the soft electrostatic transducer to provide high voltage isolation. Such an example configuration of system 1500 may include a parallel measurement capacitor $C_m$ as shown in FIG. 13 instead of the resistor $R_m$.

Figure 16:
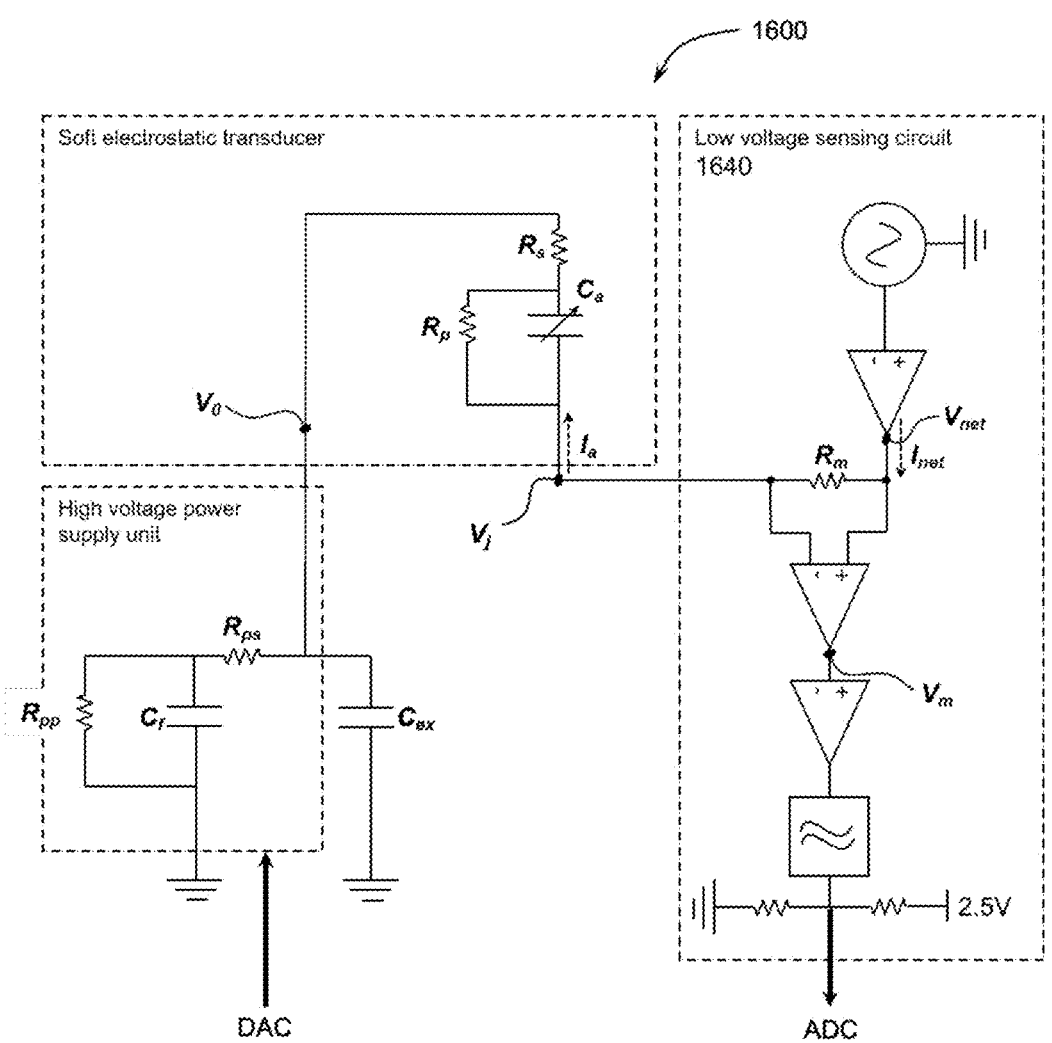
FIG. 16 depicts an additional example of a self-sensing system in which a high voltage output filtering capacitor is in parallel with the high voltage power supply unit to assist in suppressing noise from the high voltage drive signal and providing a low impedance path to ground, in accordance with aspects of this disclosure.

FIG. 16 illustrates a transducer system 1600 having a self-sensing system 1640. The system 1600 includes an external high voltage output filtering capacitor $C_{ex}$ electrically coupled with the high voltage power supply unit. The external high voltage output filtering capacitor $(C_{ex})$ may provide noise filtering of the high voltage drive signal. Thus, for example, use of the high voltage output filtering capacitor may facilitate use with high voltage power supply units that do not natively include noise filtering such as a filtering capacitor $(C_f)$. For instance, high voltage power supply units of lower cost and/or smaller size may thus be utilized with the high voltage output filtering capacitor $(C_{ex})$ providing noise filtering to the high voltage drive signal. Another noise suppression capacitor may be placed in parallel with the high voltage amplifier output to reduce the effect of noise which affects the sensitivity of the self-sensing reading. Further still, this arrangement shown in FIG. 16 provides a low impedance path to ground in case the power supply does not include a filtering capacitor $C_f$. Such an external high voltage output filtering capacitor can optionally be included in all previously described configurations (FIGS. 12-15).

Accordingly, the self-sensing systems and methods described herein enable simultaneous actuation and estimation of the deformation of a wide range of electrostatic transducers. Using the transducer to provide high voltage isolation and applying a sensing signal on the low-voltage side of the transducer enables a simple, low-cost, and robust circuit design which uses inexpensive off-the-shelf components and therefore may accommodate a wide range of high voltage power supply units.

In other contemplated configurations, instead of using an integrated ADC in the microcontroller with a maximum sampling rate of 40 kHz, the system sensing speed may be greatly improved using a dedicated high-speed ADC with DMA. In addition, self-sensing configurations described herein can be used as a tool to monitor the electrostatic transducer's electrical integrity. A soft electrostatic transducer has a significantly smaller parallel resistance $(R_p)$ after experiencing dielectric breakdown, and therefore generates a noisy signal on the self-sensing output. The self-sensing circuit may withstand the dielectric breakdown events and detect transducer failure by capturing the spurious noises from the measured capacitance. The versatility and robustness of the self-sensing circuit introduced in this work promises many possible applications and implementations in soft robotic systems, robotic grippers, prostheses, haptics, package sorting systems for logistic and manufacturing plants, self-rolling wheels, tactile displays, pumps, or the like. However, the system described herein may be used in any context in which capacitance in a system is to be measured, particularly in systems where high voltages may be present.

Figure 17:
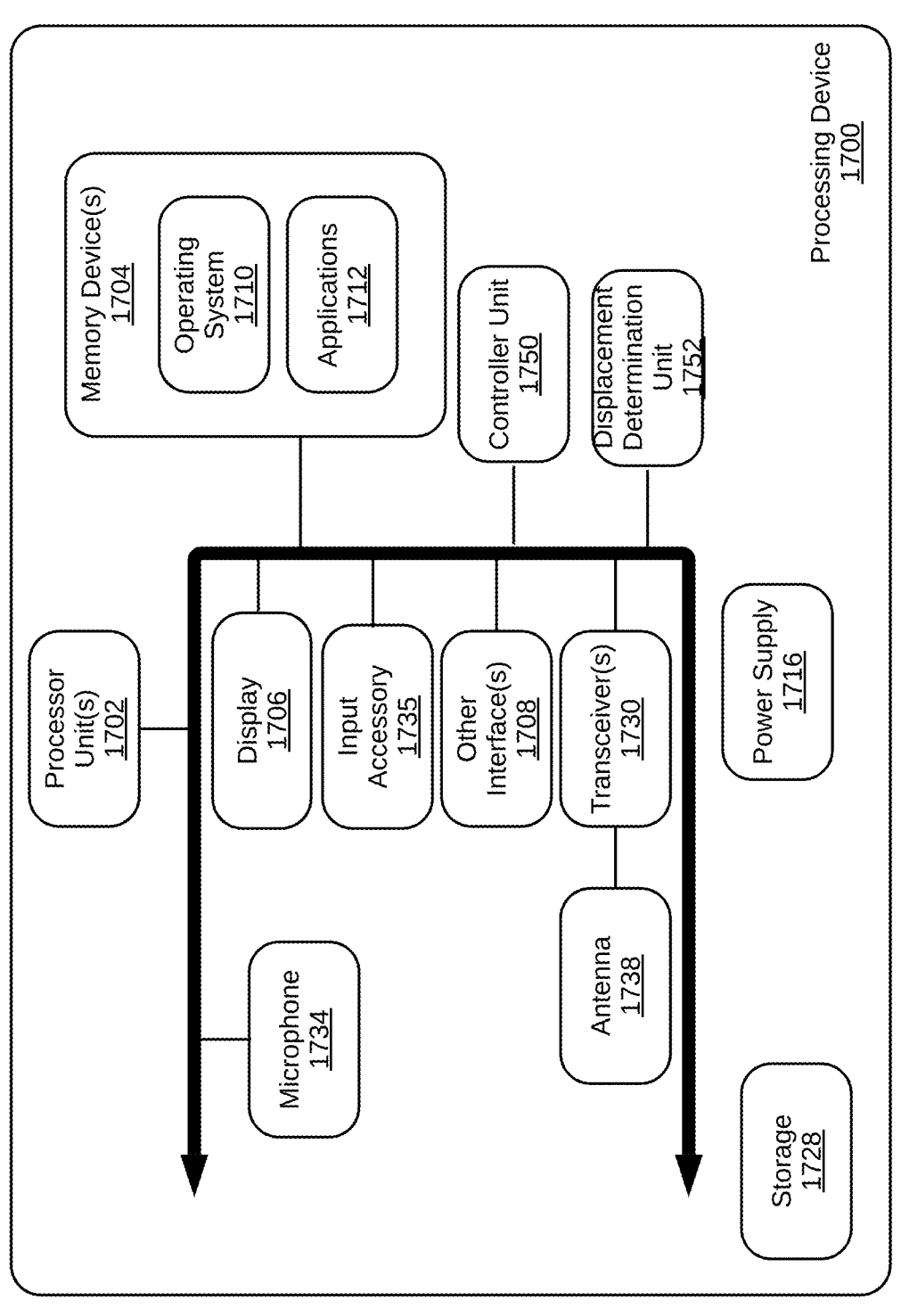
FIG. 17 depicts a computing device capable of facilitating functionality to the present system, in accordance with aspects of this disclosure.

FIG. 17 illustrates an example schematic of a processing device 1700 suitable for implementing aspects of the disclosed technology including a controller unit 1750 and/or a displacement determination unit 1752 as described above. The processing device 1700 includes one or more processor unit(s) 1702, memory 1704, a display 1706, and other interfaces 1708 (e.g., buttons). The memory 1704 generally includes both volatile memory (e.g., RAM) and non-volatile memory (e.g., flash memory). An operating system 1710, such as the Microsoft Windows® operating system, the Apple macOS operating system, or the Linux operating system, may reside in the memory 1704 and may be executed by the processor unit(s) 1702, although it should be understood that other operating systems may be employed.

One or more applications 1712 may be loaded in the memory 1704 and executed on the operating system 1710 by the processor unit(s) 1702. Applications 1712 may receive input from various input local devices such as a microphone 1734, input accessory 1735 (e.g., keypad, mouse, stylus, touchpad, joystick, instrument mounted input, or the like). Additionally, the applications 1712 may receive input from one or more remote devices such as remotely-located smart devices by communicating with such devices over a wired or wireless network using more communication transceivers 1730 and an antenna 1738 to provide network connectivity (e.g., a mobile phone network, Wi-Fi®, Bluetooth®). The processing device 1700 may also include various other components, such as a positioning system (e.g., a global positioning satellite transceiver), one or more accelerometers, one or more cameras, an audio interface (e.g., the microphone 1734, an audio amplifier and speaker and/or audio jack), and storage devices 1728. Other configurations may also be employed.

The processing device 1700 further includes a power supply 1716, which is powered by one or more batteries or other power sources and which provides power to other components of the processing device 1700. The power supply 1716 may also be connected to an external power source (not shown) that overrides or recharges the built-in batteries or other power sources.

In an example implementation, a display system may include hardware and/or software embodied by instructions stored in the memory 1704 and/or the storage devices 1728 and processed by the processor unit(s) 1702. The memory 1704 may be the memory of a host device or of an accessory that couples to the host.

The processing system 1700 may include a variety of tangible processor-readable storage media and intangible processor-readable communication signals. Tangible processor-readable storage can be embodied by any available media that can be accessed by the processing system 1700 and includes both volatile and nonvolatile storage media, removable and non-removable storage media. Tangible processor-readable storage media excludes intangible communications signals and includes volatile and nonvolatile, removable and non-removable storage media implemented in any method or technology for storage of information such as processor-readable instructions, data structures, program modules or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the processing system 1700. In contrast to tangible processor-readable storage media, intangible processor-readable communication signals may embody processor-readable instructions, data structures, program modules or other data resident in a modulated data signal, such as a carrier wave or other signal transport mechanism. The term "modulated data signal" means an intangible communications signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Various configurations and aspects of the concepts disclosed herein are contemplated:

In a first aspect, a transducer system with self-sensing includes an electrostatic transducer having a first electrode and a second electrode separated by a dielectric material, wherein the electrostatic transducer undergoes a change in capacitance in response to physical manipulation of the transducer. The system further includes a low voltage sensing unit electrically coupled to at least one of the first electrode and the second electrode for measurement of a measured capacitance of the electrostatic transducer and a voltage suppression module disposed relative to the low voltage sensing unit to isolate the low voltage sensing unit from exposure to high voltage in the transducer system.

In a second aspect, the low voltage sensing unit is operative to measure the measured capacitance in response to mechanical manipulation of the electrostatic transducer by an externally applied force.

In a third aspect, the transducer system further includes a high voltage power unit in operative communication with the first electrode to apply a high voltage drive signal to the electrostatic transducer to actuate the electrostatic transducer.

In a fourth aspect, the electrostatic transducer comprises the voltage suppression module.

In a fifth aspect, the low voltage sensing unit is in operative communication with the second electrode and is electrically isolated from the first electrode by the dielectric material of the electrostatic transducer.

In a sixth aspect, the voltage suppression module comprises at least one voltage suppression component separate from the electrostatic transducer and in operative communication with the electrostatic transducer and the low voltage suppression module.

In a seventh aspect, the at least one voltage suppression component is operative to isolate the high voltage drive signal from the low voltage sensing unit in the event of an electrical failure of the electrostatic transducer comprising dielectric breakdown of the dielectric material.

In an eighth aspect, the voltage suppression module comprises a suppression capacitor.

In a ninth aspect, the voltage suppression module comprises a suppression resistor.

In a tenth aspect, the voltage suppression module is disposed in series between the second electrode and the low voltage sensing unit.

In an $11^{th}$ aspect, the voltage suppression module is disposed in parallel with the electrostatic transducer and the low voltage sensing unit.

In a $12^{th}$ aspect, the low voltage sensing unit is operative to measure the measured capacitance of the electrostatic transducer simultaneously with the application of the high voltage drive signal to the electrostatic transducer for actuation of the electrostatic transducer during actuation of the electrostatic transducer.

In a $13^{th}$ aspect, the transducer system further includes a hardware processor in operative communication with the low voltage sensing unit and operative to determine a physical displacement of the electrostatic transducer in response to the measured capacitance of the electrostatic transducer.

In a 14th aspect, the low voltage sensing unit further includes a low voltage AC voltage generator to apply a low voltage AC signal to the second electrode, and a measurement component disposed between the low voltage AC voltage generator and the second electrode across which a voltage drop is measured for detection of the measured capacitance of the electrostatic transducer.

In a 15th aspect, the measurement component comprises a measurement resistor.

In a 16th aspect, the measurement component comprises a measurement capacitor.

In a 17th aspect, the first electrode, dielectric material, and the second electrode comprise at least one of a hydraulically amplified self-healing electrostatic transducer, a dielectric elastomer actuator, or a capacitive stretch sensor.

In an 18th aspect, method for self-sensing a measured capacitance of an electrostatic transducer is contemplated. The method includes electrically coupling a low voltage sensing unit to at least one of a first electrode or a second electrode of the electrostatic transducer, the electrostatic transducer comprising a dielectric material disposed between the high voltage electrode and a low voltage electrode, sensing a measured capacitance of the electrostatic transducer in response to physical movement of the electrostatic transducer, and isolating the low voltage sensing unit with a voltage suppression module from exposure to high voltage in the transducer system.

In a 19th aspect, the low voltage sensing unit is operative to measure the measured capacitance in response to mechanical manipulation of the electrostatic transducer by an externally applied force In a 20th aspect, the method further includes applying a high voltage drive signal to the first electrode the electrostatic transducer using a high voltage power unit electrically coupled with the first electrode, wherein the low voltage sensing unit is electrically coupled to the second electrode.

In a 21st aspect, the electrostatic transducer comprises the voltage suppression module.

In a 22nd aspect, the isolating comprises isolating the low voltage sensing unit from the first electrode by the dielectric material of the electrostatic transducer.

In a 23rd aspect, the isolating is in response to an electrical failure of the electrostatic transducer comprising dielectric breakdown of the dielectric material.

In a 24th aspect, the voltage suppression module comprises at least one voltage suppression component separate from the electrostatic transducer and in operative communication with the electrostatic transducer and the low voltage suppression module.

In a 25th aspect, the voltage suppression module comprises a suppression capacitor.

In a 26th aspect, the voltage suppression module comprises a suppression resistor.

In a 27th aspect, the sensing of the measured capacitance of the electrostatic transducer by the low voltage sensing unit occurs simultaneously with the applying the drive voltage thereto for actuation of the electrostatic transducer during actuation of the electrostatic transducer.

In a 28th aspect, the method further includes mapping the measured capacitance to a displacement of the electrostatic transducer.

In a 29th aspect, the method further includes communicating the displacement to a hardware processor in operative communication with the low voltage sensing unit.

In a 30th aspect, the method further includes modifying the drive voltage in response to the displacement to provide feedback control of the electrostatic transducer.

In a 31st aspect, the electrostatic transducer comprises at least one of a hydraulically amplified self-healing electrostatic transducer, a dielectric elastomer actuator, or a capacitive stretch sensor.

In a 32nd aspect, the electrostatic transducer comprises a HASEL actuator, and the method further includes calibrating the measured capacitance to a displacement of the electrostatic actuator by applying a fitting function to measured displacement data and the measured capacitance.

Some implementations may comprise an article of manufacture. An article of manufacture may comprise a tangible storage medium to store logic. Examples of a storage medium may include one or more types of processor-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described implementations. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain operation segment. The instructions may be implemented using any suitable high-level, low-level, object-oriented, visual, compiled and/or interpreted programming language.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language.

What is claimed is:

1. A transducer system with self-sensing, comprising:
an electrostatic transducer comprising a first electrode and a second electrode separated by a dielectric material, wherein a capacitance of the electrostatic transducer is variable as a function of a physical displacement between the first and second electrodes;

a low voltage sensing unit electrically coupled to at least one of the first electrode and the second electrode, wherein the low voltage sensing unit is configured to measure the capacitance of the electrostatic transducer; and a high voltage power supply unit in electrical communication with the first electrode, wherein the high voltage power supply unit is configured to apply a high voltage drive signal to the electrostatic transducer, and wherein the low voltage sensing unit is electrically coupled with the second electrode and is electrically isolated from the first electrode by the dielectric material of the electrostatic transducer.

2. The transducer system of claim 1, further comprising a controller unit in electrical communication with the low voltage sensing unit, wherein the controller unit is configured to calculate at least one selected from a group consisting of the physical displacement, a force, and a speed based on the capacitance measured by the low voltage sensing unit.

3. The transducer system of claim 2, wherein the low voltage sensing unit is configured to measure the capacitance of the electrostatic transducer simultaneously with the application of the high voltage drive signal to the electrostatic transducer.

4. The transducer of claim 1, wherein the low voltage sensing unit comprises a low voltage AC voltage generator configured to apply a low voltage AC signal to the first electrode; and a measurement component disposed between the low voltage AC voltage generator and the first electrode, wherein the measurement component is configured to detect a voltage drop across a measurement component.

5. The transducer system of claim 1, wherein the low voltage sensing unit comprises a low voltage AC voltage generator configured to apply a low voltage AC signal to the second electrode; and a measurement component disposed between the low voltage AC voltage generator and the second electrode, wherein the measurement component is configured to detect a voltage drop across a measurement component.

6. The transducer system of claim 5, wherein the measurement component is one selected from a group consisting of a measurement resistor and a measurement capacitor.

7. The transducer system of claim 5, wherein the voltage drop relates to the capacitance of the electrostatic transducer.

8. The transducer system of claim 1, further comprising at least one voltage suppression component separate from the electrostatic transducer and configured to prevent the low voltage sensing unit from receiving the high voltage drive signal.

9. The transducer system of claim 8, wherein the voltage suppression component is a capacitor.

10. The transducer system of claim 8, wherein at least one voltage suppression component is electrically coupled with the electrostatic transducer.

11. The transducer system of claim 10, wherein the at least one voltage suppression component is further electrically coupled with the low voltage sensing unit.

12. The transducer system of claim 11, wherein the at least one voltage suppression component is in parallel with the electrostatic transducer.

13. The transducer system of claim 1, wherein a filtering component is electrically coupled with the high voltage power supply unit and wherein the filtering component is in parallel with the electrostatic transducer.

* * * * *